United States Patent
Bailey et al.

(10) Patent No.: US 10,013,512 B2
(45) Date of Patent: Jul. 3, 2018

(54) NETWORK FLOW MODEL

(71) Applicant: SCHLUMBERGER TECHNOLOGY CORPORATION, Sugar Land, TX (US)

(72) Inventors: William Bailey, Somerville, MA (US); Mack Shippen, Houston, TX (US)

(73) Assignee: Schlumberger Technology Corporation, Sugar Land, TX (US)

(*) Notice: Subject to any disclaimer, the term of this patent is extended or adjusted under 35 U.S.C. 154(b) by 792 days.

(21) Appl. No.: 14/473,633

(22) Filed: Aug. 29, 2014

(65) Prior Publication Data
US 2016/0063146 A1 Mar. 3, 2016

(51) Int. Cl.
G06F 17/50 (2006.01)
G06F 17/10 (2006.01)
G06Q 10/06 (2012.01)
G06Q 50/02 (2012.01)
E21B 49/08 (2006.01)

(52) U.S. Cl.
CPC ........ G06F 17/5009 (2013.01); E21B 49/087 (2013.01); G06F 17/10 (2013.01); G06Q 10/06 (2013.01); G06Q 50/02 (2013.01)

(58) Field of Classification Search
CPC .. G06F 17/5009; E21B 41/0092; E21B 43/12; F17D 1/005
See application file for complete search history.

(56) References Cited

U.S. PATENT DOCUMENTS

| | | | | |
|---|---|---|---|---|
| 5,550,761 A | * | 8/1996 | Pauchon | G05B 17/02 703/6 |
| 2012/0016649 A1 | * | 1/2012 | Thambynayagam | E21B 43/12 703/10 |
| 2012/0166157 A1 | * | 6/2012 | Whittaker | E21B 43/24 703/2 |
| 2014/0207430 A1 | * | 7/2014 | Li | E21B 41/00 703/2 |
| 2016/0177686 A1 | * | 6/2016 | Carvajal | E21B 43/12 700/282 |

OTHER PUBLICATIONS

Wang et al., "A Mechanistic Slug Liquid Holdup Model for Wide Ranges of Liquid Viscosity and Pipe Inclination Angle" (May 2013) pp. 1-11 [retrieved from https://www.onepetro.org/conference-paper/OTC-24046-MS].*
Gokcal et al., "Effects of High Oil Viscosity on Drift Velocity for Upward Inclined Pipes" (Sep. 2008), pp. 1-13 [retrieved from http://www.onepetro.org/doi/10.2118/115342-MS].*
Extended European Search Report issued in related EP application 15179292.6 dated Dec. 17, 2015, 8 pages.

* cited by examiner

Primary Examiner — Brian W Wathen
(74) Attorney, Agent, or Firm — Colin L. Wier

(57) ABSTRACT

A method can include receiving information that includes data that correspond to a range of a fluid production network variable; based at least in part on a portion of the data, determining optimal parameter values of a multi-parameter proxy model for at least a portion of the range of the fluid production network variable; based at least in part on a portion of the optimal parameter values, deriving functions for the parameters of the multi-parameter proxy model; and based at least in part on the functions, determining a value of the fluid production network variable for a fluid production network.

20 Claims, 13 Drawing Sheets

Plot 810

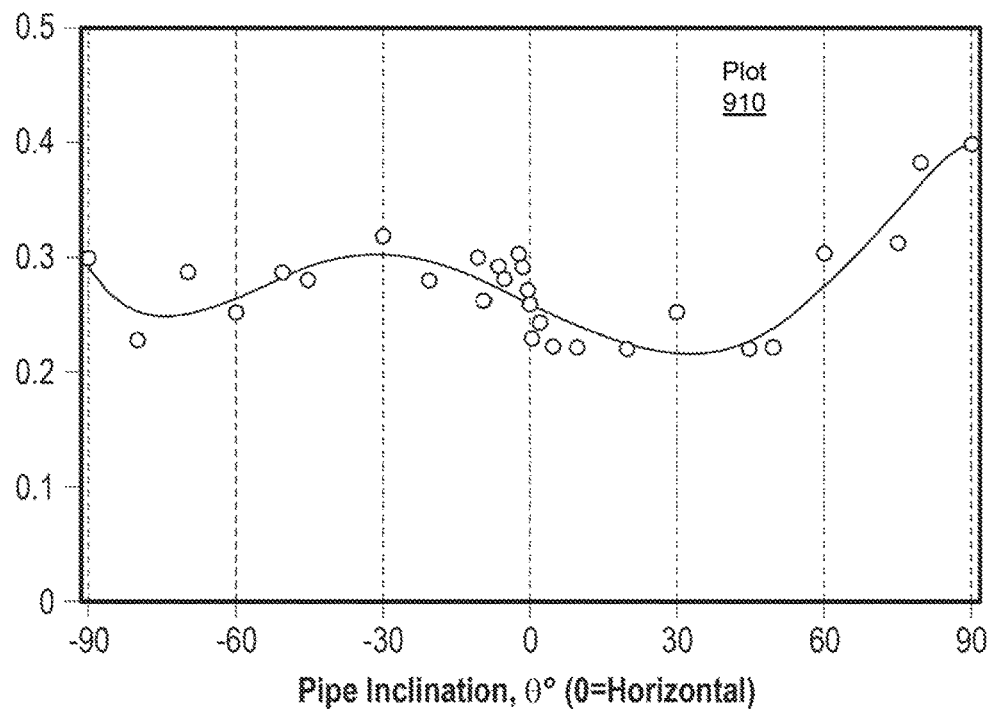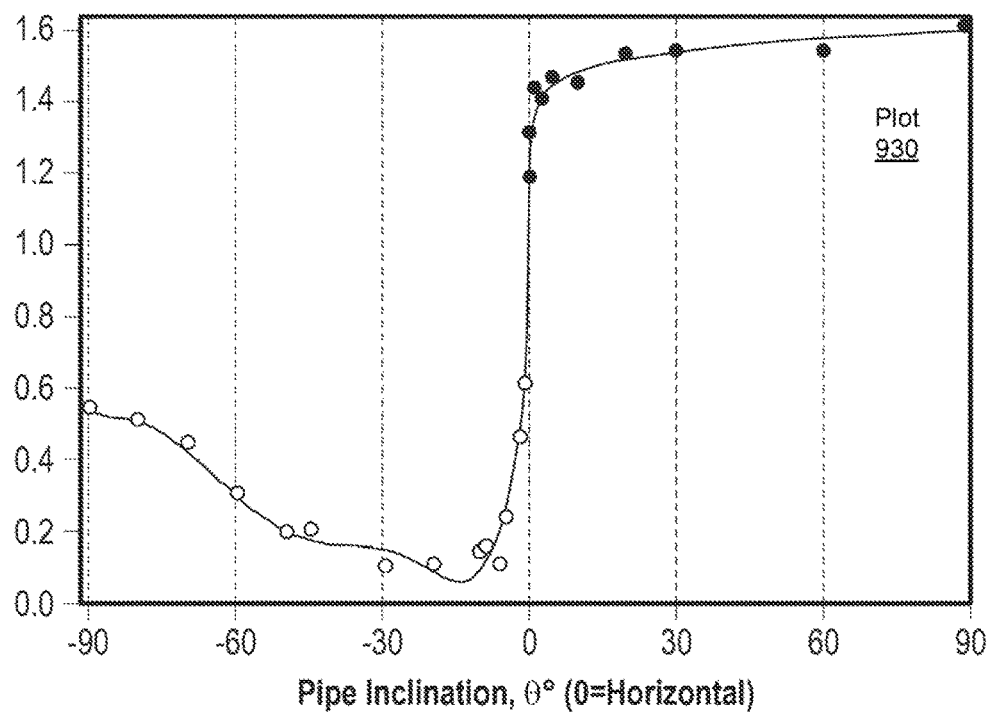
Fig. 9

| Eq. (15) → $V_j$, $H_j$ or $M_j$ | $(\lambda_j)_{k=0}$ | $(\lambda_j)_{k=1} \times \theta$ | $(\lambda_j)_{k=2} \times \theta^2$ | $(\lambda_j)_{k=3} \times \theta^3$ |
|---|---|---|---|---|
| $j = 1 : A \rightarrow V_1$ | 1.1 | $-2.885984 \times 10^{-4}$ | $-5.403076 \times 10^{-5}$ | $-3.140251 \times 10^{-7}$ |
| $j = 2 : B \rightarrow V_2$ | 0.247332 | $-2.631318 \times 10^{-3}$ | $-4.053889 \times 10^{-6}$ | $1.0461671 \times 10^{-6}$ |
| $j = 3 : a_1 \rightarrow V_3$ | 0.2 | $-5.3890117 \times 10^{-4}$ | $-2.1306077 \times 10^{-5}$ | $1.9258657 \times 10^{-7}$ |
| $j = 4 : a_2 \rightarrow V_4$ | 0.4 | $-5.389012 \times 10^{-4}$ | $-2.130808 \times 10^{-5}$ | $1.925866 \times 10^{-7}$ |
| $j = 5 : C_1 \rightarrow H_1$, see Eq. (20) | | | | |
| Polynomial when $\theta \leq -1°$: | 0.7 | $1.298952 \times 10^{-1}$ | $9.524327 \times 10^{-3}$ | $3.214762 \times 10^{-4}$ |
| Power-law when $\theta \geq +0.1°$: $\eta_0 = 1.340369$ and $\eta_1 = 3.385007 \times 10^{-2}$ | | | | |
| Otherwise interpolate between: $(H_1)_{\theta=+0.1°} = 1.239866$ and $(H_1)_{\theta=-1.0°} = 0.579313$ | | | | |
| $j = 2 : C_2 \rightarrow H_2$ | 1.760089 | 0 | 0 | 0 |
| $j = 3 : C_3 \rightarrow H_3$ | 0.561 | $1.973627 \times 10^{-5}$ | 0 | 0 |
| $j = 4 : C_4 \rightarrow H_4$ | 0.460 | $5.496190 \times 10^{-5}$ | 0 | 0 |
| $j = 5 : C_5 \rightarrow H_5$ | 1.0 | $-7.154770 \times 10^{-3}$ | $3.170298 \times 10^{-6}$ | $1.091994 \times 10^{-6}$ |
| $j = 6 : C_6 \rightarrow H_6$ | 0.40 | $-5.638780 \times 10^{-3}$ | $2.428789 \times 10^{-5}$ | $7.365165 \times 10^{-7}$ |
| $j = 1 : m_1 \rightarrow M_1$ | 0.65 | $-6.700422 \times 10^{-3}$ | $4.482001 \times 10^{-4}$ | $8.246437 \times 10^{-7}$ |
| $j = 2 : m_2 \rightarrow M_2$ | 1.0 | 0 | 0 | 0 |

| Eq. (15) → $V_j$, $H_j$ or $M_j$... cont'd | $(\lambda_j)_{k=4} \times \theta^4$ | $(\lambda_j)_{k=5} \times \theta^5$ | $(\lambda_j)_{k=6} \times \theta^6$ |
|---|---|---|---|
| $j = 1 : A \rightarrow V_1$... cont'd (polynomial) | $1.536983 \times 10^{-8}$ | $4.253424 \times 10^{-11}$ | $-9.571967 \times 10^{-13}$ |
| $j = 2 : B \rightarrow V_2$... cont'd (polynomial) | $2.358497 \times 10^{-9}$ | $-7.682885 \times 10^{-11}$ | 0 |
| $j = 3 : a_1 \rightarrow V_3$... cont'd (polynomial) | $5.3535068 \times 10^{-9}$ | 0 | 0 |
| $j = 4 : a_2 \rightarrow V_4$... cont'd (polynomial) | $5.353507 \times 10^{-9}$ | 0 | 0 |
| $j = 1 : C_1 \rightarrow H_1$... cont'd (piece-wise function), see Eq. (20) | | | |
| Polynomial when $\theta \leq -1°$: | $5.500143 \times 10^{-6}$ | $4.583278 \times 10^{-8}$ | $1.477412 \times 10^{-10}$ |
| Power-law when $\theta \geq +0.1°$: Value for $\eta_0$ and $\eta_1$ shown above | | | |
| Otherwise interpolate: use value shown above | | | |
| $j = 2 : C_2 \rightarrow H_2$... cont'd (constant) | 0 | 0 | 0 |
| $j = 3 : C_3 \rightarrow H_3$... cont'd (linear) | 0 | 0 | 0 |
| $j = 4 : C_4 \rightarrow H_4$... cont'd (linear) | 0 | 0 | 0 |
| $j = 5 : C_5 \rightarrow H_5$... cont'd (polynomial) | 0 | 0 | 0 |
| $j = 6 : C_6 \rightarrow H_6$... cont'd (polynomial) | $-1.4352330 \times 10^{-9}$ | 0 | 0 |
| $j = 11 : m_1 \rightarrow M_1$... cont'd (polynomial) | $-1.4672761 \times 10^{-7}$ | $2.505489 \times 10^{-11}$ | $1.188445 \times 10^{-11}$ |
| $j = 12 : m_2 \rightarrow M_2$... cont'd | 0 | 0 | 0 |

Fig. 10

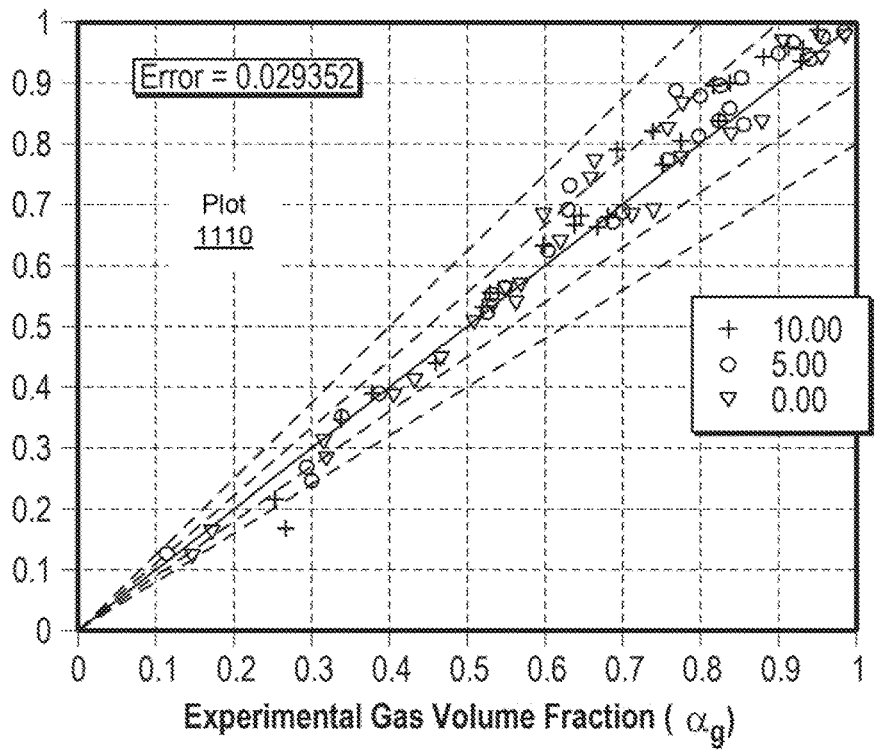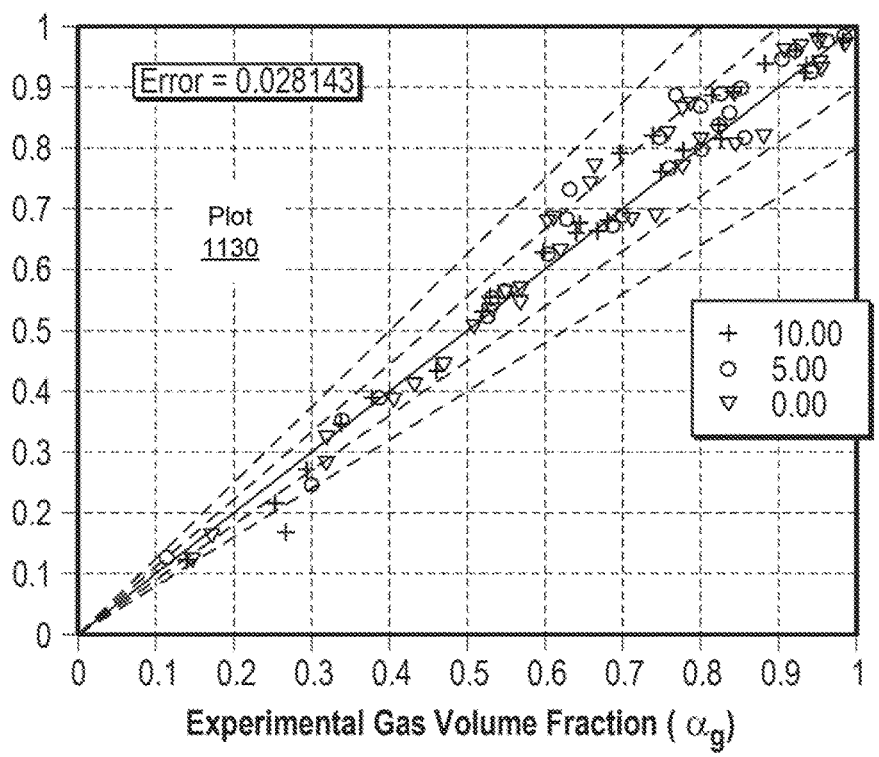
Fig. 11

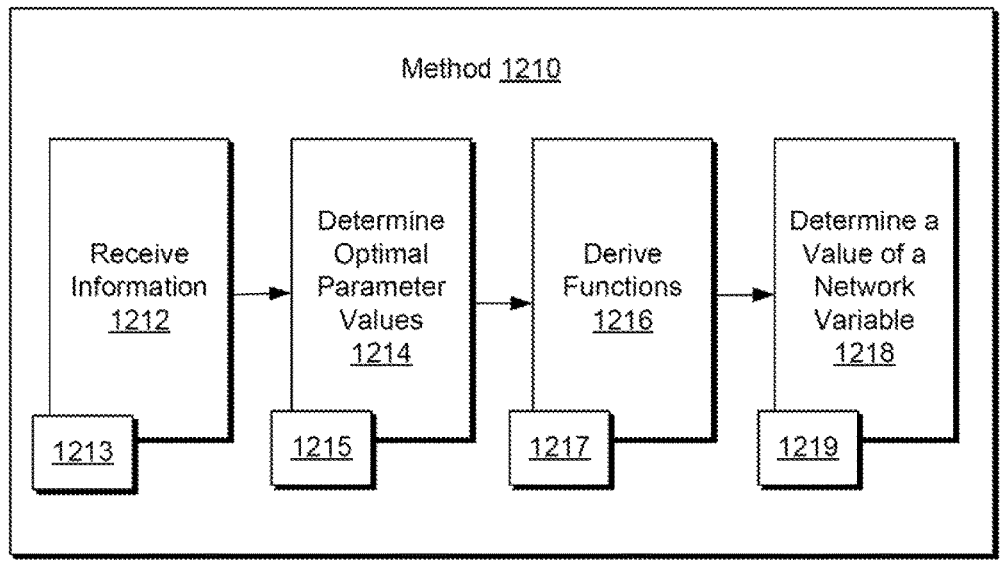
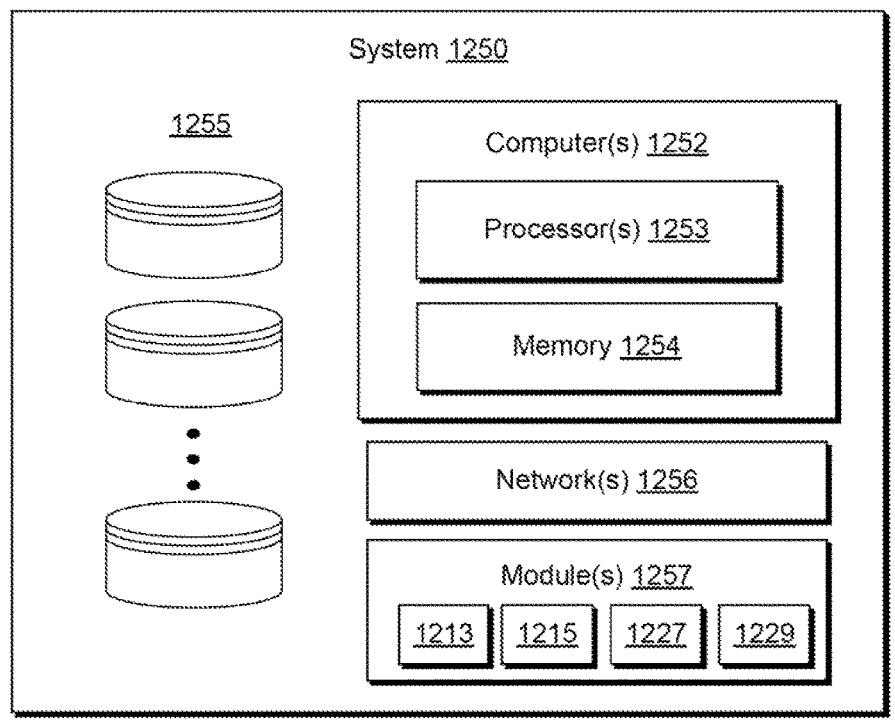
Fig. 12

NETWORK FLOW MODEL

BACKGROUND

Production systems can provide for transportation of oil and gas fluids from well locations to processing facilities and represent a substantial investment in infrastructure that may have both economic and environmental impact. To develop, build and operate such systems, which may include hundreds or thousands of flowlines and pieces of production equipment interconnected at junctions to form a network, an understanding of thermodynamics, fluid dynamics (e.g., including physics of multiphase flows), etc. can be beneficial.

SUMMARY

A method can include receiving information that includes data that correspond to a range of a fluid production network variable, determining optimal parameter values of a multi-parameter proxy model for at least a portion of the range of the fluid production network variable, deriving functions for the parameters of the multi-parameter proxy model, and determining a value of the fluid production network variable for a fluid production network. A system can include a processor; memory accessible by the processor and modules that include instructions to: receive information that includes data that correspond to a range of a fluid production network variable, determine optimal parameter values of a multi-parameter proxy model for at least a portion of the range of the fluid production network variable, and derive functions for the parameters of the multi-parameter proxy model. A computer-readable storage medium or media can include instructions executable by a computer to receive information that includes data that correspond to a range of a fluid production network variable, determine optimal parameter values of a multi-parameter proxy model for at least a portion of the range of the fluid production network variable, and derive functions for the parameters of the multi-parameter proxy model.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

FIG. 9 illustrates examples of plots;

FIG. 10 illustrates an example of a table;

FIG. 11 illustrates examples of plots;

FIG. 12 illustrates an example of a system, an example of a method and examples of modules.

DETAILED DESCRIPTION

The following description includes the best mode presently contemplated for practicing the described implementations. This description is not to be taken in a limiting sense, but rather is made merely for the purpose of describing the general principles of the implementations. The scope of the described implementations should be ascertained with reference to the issued claims.

Figure 1:
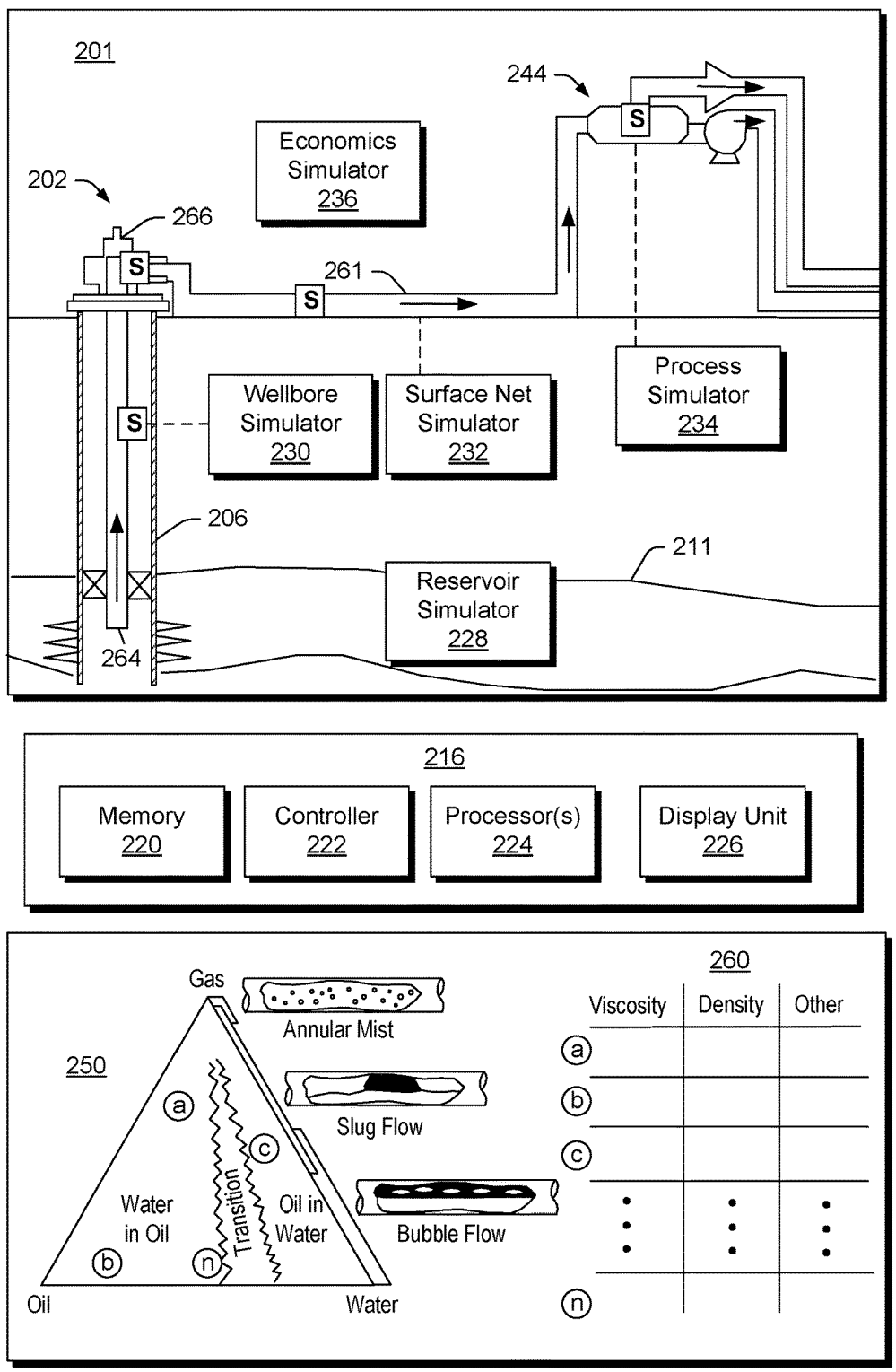
FIG. 1 illustrates an example field system that includes various components, an example of a method and an example of a device or system.

FIG. 1 shows an example of a geologic environment 110 that includes reservoirs 111-1 and 111-2, which may be faulted by faults 112-1 and 112-2, an example of a method 150 and an example of a device or system 170. FIG. 1 also shows some examples of offshore equipment 114 for oil and gas operations related to the reservoirs 111-1 and 111-2 and onshore equipment 116 for oil and gas operations related to the reservoir 111-1.

As an example, a model may be made that models a geologic environment in combination with equipment, wells, etc. For example, a model may be a flow simulation model for use by a simulator to simulate flow in an oil, gas or oil and gas production system. Such a flow simulation model may include equations, for example, to model multiphase flow from a reservoir to a wellhead, from a wellhead to a reservoir, etc. A flow simulation model may also include equations that account for flowline and surface facility performance, for example, to perform a comprehensive production system analysis.

As an example, a flow simulation model may be a network model that includes various sub-networks specified using nodes, segments, branches, etc. As an example, a flow simulation model may be specified in a manner that provides for modeling of branched segments, multilateral segments, complex completions, intelligent downhole controls, etc.

As an example, a system may provide for transportation of oil and gas fluids from well locations to processing facilities and may represent a substantial investment in infrastructure with both economic and environmental impact. Simulation of such a system, which may include hundreds or thousands of flow lines and production equipment interconnected at junctions to form a network, can involve multiphase flow science and, for example, use of engineering and mathematical techniques for large systems of equations.

As an example, a flow simulation model may include equations for performing nodal analysis, pressure-volume-temperature (PVT) analysis, gas lift analysis, erosion analysis, corrosion analysis, production analysis, injection analysis, etc. In such an example, one or more analyses may be based, in part, on a simulation of flow in a modeled network.

As to nodal analysis, it may provide for evaluation of well performance, for making decisions as to completions, etc. A nodal analysis may provide for an understanding of behavior of a system and optionally sensitivity of a system (e.g., production, injection, production and injection). For example, a system variable may be selected for investigation and a sensitivity analysis performed. Such an analysis may include plotting inflow and outflow of fluid at a nodal point or nodal points in the system, which may indicate where certain opportunities exist (e.g., for injection, for production, etc.).

A modeling framework may include modules to facilitate generation of a flow simulation model. For example, a module may provide for modeling completions for vertical wells, completions for horizontal wells, completions for fractured wells, etc. A modeling framework may include modules for particular types of equations, for example, black-oil equations, equation-of-state (EOS) equations, etc. A modeling framework may include modules for artificial lift, for example, to model fluid injection, fluid pumping, etc. As an example, consider a module that includes features for modeling one or more electric submersible pumps (ESPs) (e.g., based in part on pump performance curves, motors, cables, etc.).

As an example, an analysis using a flow simulation model may be a network analysis to: identify production bottlenecks and constraints; assess benefits of new wells, additional pipelines, compression systems, etc.; calculate deliverability from field gathering systems; predict pressure and temperature profiles through flow paths; or plan full-field development.

As an example, a flow simulation model may provide for analyses with respect to future times, for example, to allow for optimization of production equipment, injection equipment, etc. As an example, consider an optimal time-based and conditional-event logic representation for daily field development operations that can be used to evaluate drilling of new developmental wells, installing additional processing facilities over time, choke-adjusted wells to meet production and operating limits, shutting in of depleting wells as reservoir conditions decline, etc.

As to equations, a flow simulation model may include one or more sets of equations for three-phase mechanistic multiphase flow (e.g., according to one or more of a LEDA-FLOW™ point model (Kongsberg Oil & Gas Technologies AS, Sandvika, Norway), OLGA-S™ model (Schlumberger Ltd, Houston, Tex.), TUFFP unified mechanistic models (Tulsa University Fluid Flow Projects, Tulsa, Okla.), etc.).

As to the method 150 of FIG. 1, it can include a build block 152 for building a network model that represents a production system for fluid; an assignment block 154 for assigning equations to sub-networks in the network model (e.g., where at least one of the sub-networks is optionally assigned equations formulated for solving for enthalpy implicitly or temperature implicitly), a provision block 156 for providing data; a transfer block 158 for transferring the data to the network model; and a simulation block 160 for simulating physical phenomena associated with the production system using the network model to provide simulation results.

The method 150 is shown in FIG. 1 in association with various computer-readable media (CRM) blocks 153, 155, 157, 159 and 161. Such blocks generally include instructions suitable for execution by one or more processors (or processing cores) 172 to instruct the computing device or system 170 to perform one or more actions. While various blocks are shown, a single medium may be configured with instructions to allow for, at least in part, performance of various actions of the method 150. As an example, a computer-readable medium (CRM) may be a computer-readable storage medium that is not a carrier wave, for example, such as a memory device 174 of the computing device or system 170, where the memory device 174 includes memory.

A production system can include equipment, for example, where a piece of equipment of the production system may be represented in a sub-network of a network model and, for example, assigned equations formulated to represent the piece of equipment as non-adiabatic (e.g., or adiabatic). As an example, a piece of equipment may include an electric motor operatively coupled to a mechanism to move fluid (e.g., a pump, compressor, etc.). As an example, a piece of equipment may include a heater coupled to a power source, a fuel source, etc. (e.g., consider a steam generator). As an example, a piece of equipment may include a conduit for delivery of fluid where the fluid may be for delivery of heat energy (e.g., consider a steam injector). As an example, a piece of equipment may include a conduit for delivery of a substance (e.g., a chemical, a proppant, etc.).

As an example, a sub-network may be assigned equations formulated for solving for enthalpy implicitly or temperature implicitly to represent fluid at or near a critical point, to represent heavy oil, to represent steam, to represent water or one or more other fluids (e.g., optionally subject to certain physical phenomena such as pressure, temperature, etc.).

As an example, a system can include a processor; a memory device having memory accessible by the processor, and one or more modules that include processor-executable instructions stored in the memory of the memory device, the instructions executable to instruct the system to: build a network model that represents a production system for fluid, assign equations to sub-networks in the network model, provide data, transfer the data to the network model, and simulate physical phenomena associated with the production system using the network model to provide simulation results.

As an example, a system can include a sub-network assigned equations formulated for steam associated with equipment for an enhanced oil recovery (EOR) process (e.g., steam-assisted gravity drainage (SAGD) and/or other EOR process).

As an example, a system can include a sub-network that represents a piece of equipment of a production system by assigning that sub-network equations formulated to represent the piece of equipment. In such an example, the piece of equipment may include an electric motor operatively coupled to a mechanism to move fluid (e.g., a compressor, a pump, etc.).

As an example, one or more computer-readable media can include computer-executable instructions executable by a computer to instruct the computer to: receive simulation results for physical phenomena associated with a production system modeled by a network model; and analyze the simulation results.

Figure 2:
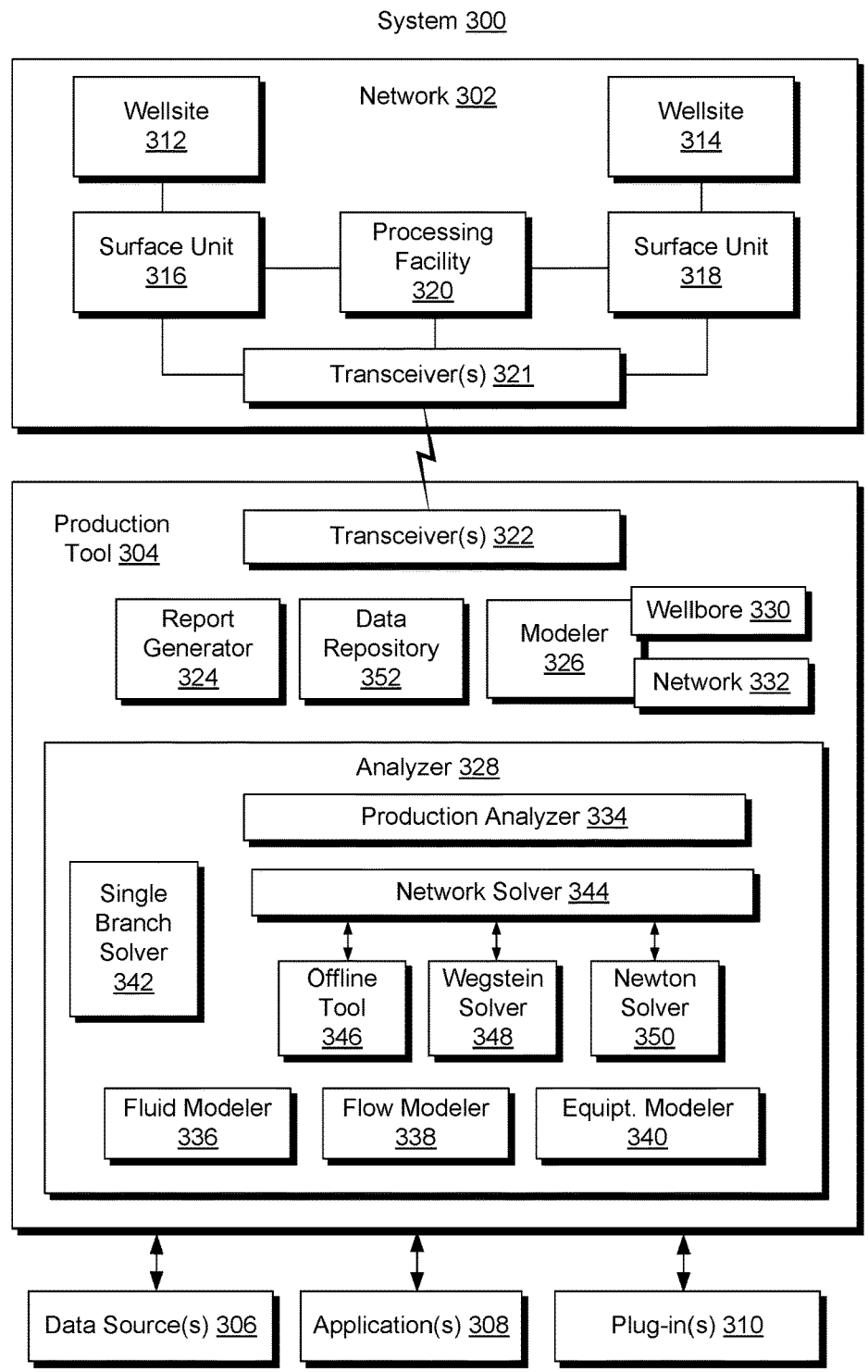
FIG. 2 illustrates an example of a system and an example of a ternary diagram with an example of an associated table of fluid properties.

FIG. 2 shows an example of a schematic view of a portion of a geologic environment 201 that includes equipment and an example of a ternary diagram 250 with an example of a table of associated fluid properties 260. As shown in FIG. 2, the environment 201 includes a wellsite 202 and a network 244. The wellsite 202 includes a wellbore 206 extending into earth as completed and prepared for production of fluid from a reservoir 211.

In the example of FIG. 2, wellbore production equipment 264 extends from a wellhead 266 of the wellsite 202 and to the reservoir 211 to draw fluid to the surface. As shown, the wellsite 202 is operatively connected to the network 244 via a transport line 261. As indicated by various arrows, fluid can flow from the reservoir 211, through the wellbore 206 and onto the network 244. Fluid can then flow from the network 244, for example, to one or more fluid processing facilities.

In the example of FIG. 2, sensors (S) are located, for example, to monitor various parameters during operations. The sensors (S) may measure, for example, pressure, temperature, flowrate, composition, and other parameters of the reservoir, wellbore, gathering network, process facilities and/or other portions of an operation. As an example, the sensors (S) may be operatively connected to a surface unit 216 (e.g., to instruct the sensors to acquire data, to collect data from the sensors, etc.).

In the example of FIG. 2, the surface unit 216 can include computer facilities, such as a memory device 220, a controller 222, one or more processors 224, and display unit 226 (e.g., for managing data, visualizing results of an analysis, etc.). As an example, data may be collected in the memory device 220 and processed by the processor(s) 224 (e.g., for analysis, etc.). As an example, data may be collected from the sensors (S) and/or by one or more other sources. For example, data may be supplemented by historical data collected from other operations, user inputs, etc. As an example, analyzed data may be used to in a decision making process.

In the example of FIG. 2, a transceiver may be provided to allow communications between the surface unit 216 and one or more pieces of equipment in the environment 201. For example, the controller 222 may be used to actuate mechanisms in the environment 201 via the transceiver, optionally based on one or more decisions of a decision making process. In such a manner, equipment in the environment 201 may be selectively adjusted based at least in part on collected data. Such adjustments may be made, for example, automatically based on computer protocol, manually by an operator or both. As an example, one or more well plans may be adjusted (e.g., to select optimum operating conditions, to avoid problems, etc.).

To facilitate data analyses, one or more simulators may be implemented (e.g., optionally via the surface unit 216 or other unit, system, etc.). As an example, data fed into one or more simulators may be historical data, real time data or combinations thereof. As an example, simulation through one or more simulators may be repeated or adjusted based on the data received.

In the example of FIG. 2, simulators can include a reservoir simulator 228, a wellbore simulator 230, and a surface network simulator 232, a process simulator 234 and an economics simulator 236. As an example, the reservoir simulator 228 may be configured to solve for hydrocarbon flow rate through a reservoir and into one or more wellbores. As an example, the wellbore simulator 230 and surface network simulator 232 may be configured to solve for hydrocarbon flow rate through a wellbore and a surface gathering network of pipelines. As to the process simulator 234, it may be configured to model a processing plant where fluid containing hydrocarbons is separated into its constituent components (e.g., methane, ethane, propane, etc.), for example, and prepared for further distribution (e.g., transport via road, rail, pipe, etc.) and optionally sale. As an example, the economics simulator 236 may be configured to model costs associated with at least part of an operation.

In FIG. 2, the ternary diagram 250 includes vertices that represent single-phase gas, oil and water, while the sides represent two phase mixtures (e.g., gas-oil, oil-water and gas-water) and points within the triangle represents a three-phase mixture. The transition region indicates where the liquid fraction changes from water in oil to oil in water and vice versa (e.g., consider emulsions).

The ternary diagram 250 of FIG. 2 also indicates some examples of ranges of multiphase flow regimes, which may be affected by one or more factors such as, for example, temperature, pressure, viscosity, density, flowline orientation, etc. The example flow regimes include annular mist, slug flow and bubble flow; noting that other types of may occur (e.g., chum, disperse, etc.). Annular mist flow may be characterized by, for example, a layer of liquid on the wall of a pipe and droplets of liquid in a middle gas zone (e.g., mist). Slug flow may be characterized by, for example, a continuous liquid phase and a discontinuous liquid phase that is discontinuous due to separation by pockets of gas. Bubble flow may be characterized by, for example, two continuous liquid phases where at least one of the continuous liquid phases includes gas bubbles. The illustrative graphics of flow regimes in FIG. 2 correspond to flows in approximately horizontal conduits; noting that a conduit may be disposed at an angle other than horizontal and that various factors that can influence flow may depend on angle of a conduit. For example, the angle of a conduit with respect to gravity can have an influence on how fluid flows in the conduit.

The table 260 of FIG. 2 shows viscosity and density as fluid properties. As to one or more other properties, consider, for example, surface tension. As indicated, the table 260 can include information for points specified with respect to the ternary diagram 250. As an example, factors such as pressure, volume and temperature may be considered, for example, as to values of fluid properties, phases, flow regimes, etc.

As an example, information as to flow of fluid may be illustrated as a flow regime map that identifies flow patterns occurring in various parts of a parameter space defined by component flow rates. For example, consider flow rates such as volume fluxes, mass fluxes, momentum fluxes, or one or more other quantities. Boundaries between various flow patterns in a flow regime map may occur where a regime becomes unstable and where growth of such instability causes transition to another flow pattern. As in laminar-to-turbulent transition in single phase flow, multiphase transitions may be rather unpredictable as they may depend on otherwise minor features of the flow, such as the roughness of the walls or the entrance conditions. Thus, as indicated in the ternary diagram 250, flow pattern boundaries may lack distinctiveness and exhibit transition zones.

As to properties, where fluid is single phase (e.g., water, oil or gas), a single value of viscosity may suffice for given conditions. However, where fluid is multiphase, two or more concurrent phases may occupy a flow space within a conduit (e.g., a pipe). In such an example, a single value of viscosity (e.g., or density) may not property characterize the fluid in that flow space. Accordingly, as an example, a value or values of mixture viscosities may be used, for example, where a mixture value is a function of phase fraction(s) for fluid in a multiphase flow space. As an example, consider three-phase flow of oil, water and gas where a mixture viscosity value may be specified for oil/water liquid and a single phase viscosity value may be specified for gas. In such an example, given liquid of 35 percent water (water fraction of 0.35) and 65 percent oil (oil fraction of 0.65), a mixture viscosity may be calculated as follows: $\mu_{mix}=0.35\mu_{water}+0.65\mu_{oil}$. Such an approach may be implemented for one or more other properties. As to density, consider an equation such as, for example: $\Delta\rho=\rho_{water}-\rho_{oil}$.

As to surface tension (e.g., $\sigma$), it may be defined for gas and liquid, for example, where the liquid may be oil or water. Where two-phase liquid-liquid flow exists (e.g., water and oil), then a may reflect the interfacial tension between oil and water (see, e.g., the slug flow regime and the bubble flow regime).

Figure 3:
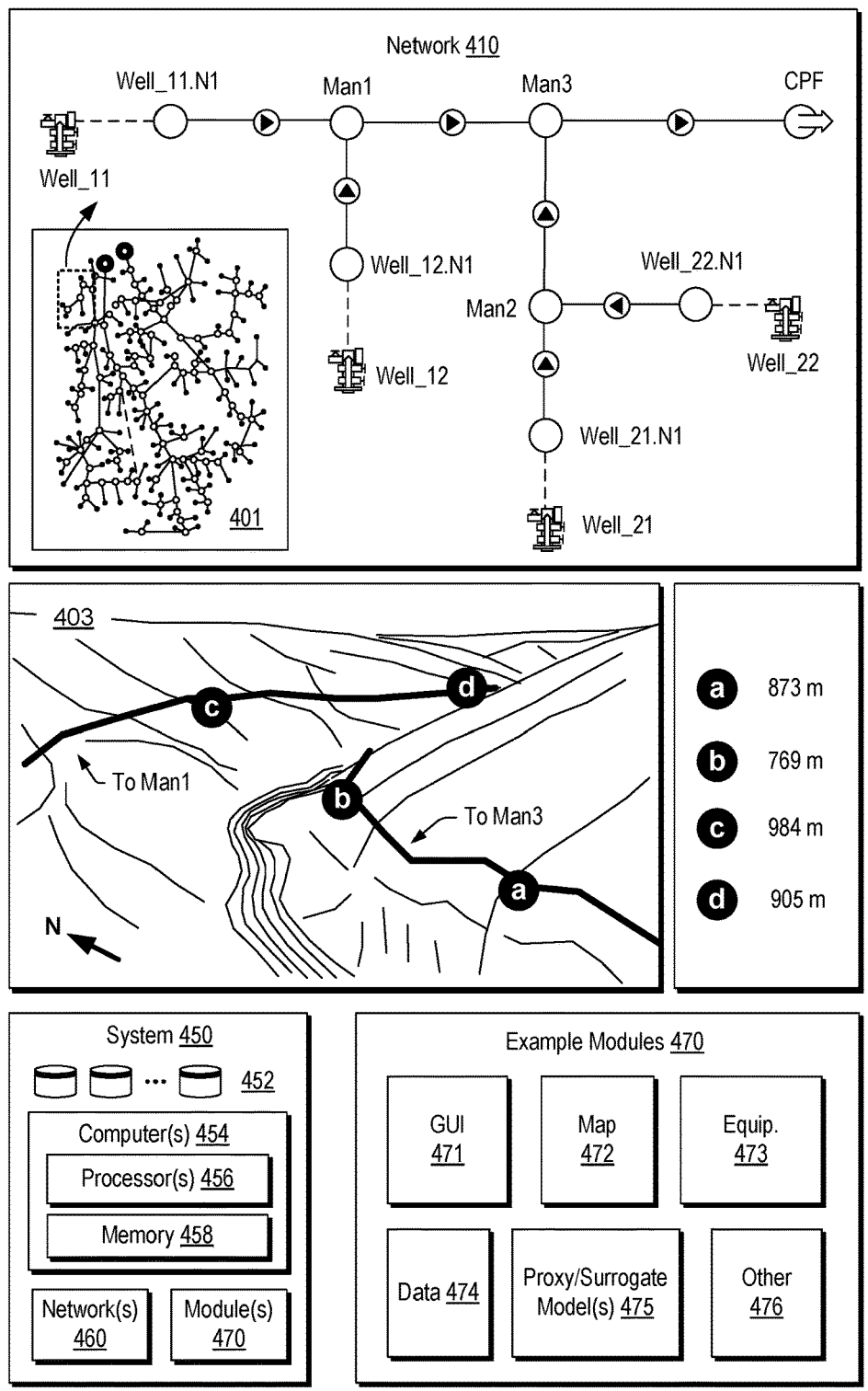
FIG. 3 illustrates an example of a system.

FIG. 3 shows an example of a schematic diagram of a production system 300 for performing oilfield production operations. As shown in the example of FIG. 3, the production system 300 can include an oilfield network 302, an oilfield production tool 304, one or more data sources 306, one or more oilfield application(s) 308, and one or more plug-in(s) 310. As an example, the oilfield network 302 can be an interconnection of pipes (e.g., conduits) that connects wellsites (e.g., a wellsite 1 312, a wellsite n 314, etc.) to a processing facility 320. A pipe in the oilfield network 302 may be connected to a processing facility (e.g., a processing facility 320), a wellsite (e.g., the wellsite 1 312, the wellsite n 314, etc.), and/or a junction in which pipes are connected. As an example, flow rate of fluid and/or gas into pipes may be adjustable; thus, certain pipes in the oilfield network 302 may be choked or closed so as to not allow fluid and/or gas through the pipe. A pipe may be considered open (e.g., optionally choked) when the pipe allows for flow of fluid and/or gas. As to a choke, choking may allow for adjusting one or more characteristics of a piece of flow equipment (e.g., a cross-sectional flow area, etc.), for example, for adjusting to fully open flow, for adjusting to choked flow and/or for adjusting to no flow (e.g., closed).

As an example, a choke may include an orifice that is used to control fluid flow rate or downstream system pressure. As an example, a choke may be provided in any of a variety of configurations (e.g., for fixed and/or adjustable modes of operation). As an example, an adjustable choke may enable fluid flow and pressure parameters to be changed to suit process or production requirements. As an example, a fixed choke may be configured for resistance to erosion under prolonged operation or production of abrasive fluids.

The oilfield network 302 may be a gathering network and/or an injection network. A gathering network may be an oilfield network used to obtain hydrocarbons from a wellsite (e.g., the wellsite 1 312, the wellsite n 314, etc.). In a gathering network, hydrocarbons may flow from the wellsites to the processing facility 320. An injection network may be an oilfield network used to inject the wellsites with injection substances, such as water, carbon dioxide, and other chemicals that may be injected into the wellsites. In an injection network, the flow of the injection substance may flow towards the wellsite (e.g., toward the wellsite 1 312, the wellsite n 314, etc.).

The oilfield network 302 may also include one or more surface units (e.g., a surface unit 1 316, a surface unit n 318, etc.), for example, a surface unit for each wellsite. Such surface units may include functionality to collect data from sensors (see, e.g., the surface unit 216 of FIG. 2). Such sensors may include sensors for measuring flow rate, water cut, gas lift rate, pressure, and/or other such variables related to measuring and monitoring hydrocarbon production. As shown, the oilfield network 302 can include one or more transceivers 321, for example, to receive information, to transmit information, to receive information and transmit information, etc. As an example, information may be received and/or transmitted via wire and/or wirelessly. As an example, information may be received and/or transmitted via a communications network such as, for example, the Internet, the Cloud, a cellular network, a satellite network, etc.

As an example, the oilfield production tool 304 may be connected to the oilfield network 302. The oilfield production tool 304 may be a simulator (e.g., a simulation framework) or a plug-in for a simulator (e.g., or other application(s)). The oilfield production tool 304 may include one or more transceivers 322, a report generator 324, an oilfield modeler 326, and an oilfield analyzer 328. As an example, the one or more transceivers 322 may be configured to receive information, to transmit information, to receive information and transmit information, etc. As an example, information may be received and/or transmitted via wire and/or wirelessly. As an example, information may be received and/or transmitted via a communications network such as, for example, the Internet, the Cloud, a cellular network, a satellite network, etc.

As an example, one or more of the one or more transceivers 322 may include functionality to collect oilfield data. The oilfield data may be data from sensors, historical data, or any other such data. One or more of the one or more transceivers 322 may also include functionality to interact with a user and display data such as a production result.

As an example, the report generator 324 can include functionality to produce graphical and textual reports. Such reports may show historical oilfield data, production models, production results, sensor data, aggregated oilfield data, or any other such type of data.

As an example, the data repository 352 may be a storage unit and/or device (e.g., a file system, database, collection of tables, or any other storage mechanism) for storing data, such as the production results, sensor data, aggregated oilfield data, or any other such type of data. As an example, the data repository 352 may include multiple different storage units and/or hardware devices. Such multiple different storage units and/or devices may or may not be of the same type or located at the same physical site. As an example, the data repository 352, or a portion thereof, may be secured via one or more security protocols, whether physical, algorithmic or a combination thereof (e.g., data encryption, secure device access, secure communication, etc.).

In the example of FIG. 3, the oilfield modeler 326 can include functionality to create a model of a wellbore and an oilfield network. As shown, the oilfield modeler 326 includes a wellbore modeler 330 and a network modeler 332. As an example, the wellbore modeler 330 can allow a user to create a graphical wellbore model or single branch model. As an example, a wellbore model can define operating parameters (e.g., actual, theoretical, etc.) of a wellbore (e.g., pressure, flow rate, etc). As an example, a single branch model may define operating parameters of a single branch in an oilfield network.

As to the network modeler 332, it may allow a user to create a graphical network model that combines wellbore models and/or single branch models. As an example, the network modeler 328 and/or wellbore modeler 330 may model pipes in the oilfield network 302 as branches of the oilfield network 302 (e.g., optionally as one or more segments, optionally with one or more nodes, etc.). In such an example, each branch may be connected to a wellsite or a junction. A junction may be defined as a group of two or more pipes that intersect at a particular location (e.g., a junction may be a node or a type of node).

As an example, a modeled oilfield network may be formed as a combination of sub-networks. In such an example, a sub-network may be defined as a portion of an oilfield network. For example, a sub-network may be connected to the oilfield network 302 using at least one branch. Sub-networks may be a group of connected wellsites, branches, and junctions. As an example, sub-networks may be disjoint (e.g., branches and wellsites in one sub-network may not exist in another sub-network).

As an example, the oilfield analyzer 328 can include functionality to analyze the oilfield network 302 and generate a production result for the oilfield network 302. As shown in the example of FIG. 3, the oilfield analyzer 328 may include one or more of the following: a production analyzer 334, a fluid modeler 336, a flow modeler 338, an equipment modeler 340, a single branch solver 342, a network solver 344, a Wegstein solver 348, a Newton solver 350, and an offline tool 346.

As an example, the production analyzer 334 can include functionality to receive a workflow request and interact with the single branch solver 342 and/or the network solver 344 based on particular aspects of the workflow. For example, the workflow may include a nodal analysis to analyze a wellsite or junction of branches, pressure and temperature profile, model calibration, gas lift design, gas lift optimization, network analysis, and other such workflows.

As an example, the fluid modeler 336 can include functionality to calculate fluid properties (e.g., phases present, densities, viscosities, etc.) using one or more compositional and/or black-oil fluid models. The fluid modeler 336 may include functionality to model oil, gas, water, hydrate, wax, and asphaltene phases. As an example, the flow modeler 338 can include functionality to calculate pressure drop in pipes (e.g., pipes, tubing, etc.) using industry standard multiphase flow correlations. As an example, the equipment modeler 340 can include functionality to calculate pressure changes in equipment pieces (e.g., chokes, pumps, compressors, etc.). As an example, one or more substances may be introduced via a network for purposes of managing asphaltenes, waxes, etc. As an example, a modeler may include functionality to model interaction between one or more substances and fluid (e.g., including material present in the fluid).

As an example, the single branch solver 342 may include functionality to calculate the flow and pressure drop in a wellbore or a single flowline branch given various inputs.

As an example, the network solver 344 can includes functionality calculate a flow rate and pressure drop throughout the oilfield network 302. The network solver 344 may be configured to connect to the offline tool 346, the Wegstein solver 348, and the Newton solver 350. As an example, alternatively or additionally, one or more other solvers may be provided, for example, consider a sequential linear programming solver (SLP), a sequential quadratic programming solver (SQP), etc. As an example, a solver may be part of the production tool 304, part of the analyzer 328 of the production tool 304, part of a system to which the production tool 304 may be operatively coupled, etc.

As an example, the offline tool 346 may include a wells offline tool and a branches offline tool. A wells offline tool may include functionality to generate a production model using the single branch solver 342 for a wellsite or branch. A branches offline tool may include functionality to generate a production model for a sub-network using the production model for a wellsite, a single branch, or a sub-network of the sub-network.

As an example, a production model may be capable of providing a description of a wellsite with respect to various operational conditions. A production model may include one or more production functions that may be combined, for example, where each production function may be a function of variables related to the production of hydrocarbons. For example, a production function may be a function of flow rate and/or pressure. Further, a production function may account for environmental conditions related to a sub-network of the oilfield network 302, such as changes in elevation (e.g., for gravity head, pressure, etc.), diameters of pipes, combination of pipes, and changes in pressure resulting from joining pipes. A production model may provide estimates of flow rate for a wellsite or sub-network of an oilfield network.

As an example, one or more separate production functions may exist that can account for changes in one or more values of an operational condition. An operational condition may identify a property of hydrocarbons or injection substance. For example, an operational condition may include a water-cut (WC), reservoir pressure, gas lift rate, etc. Other operational conditions, variables, environmental conditions may be considered.

As to the network solver 344, in the example of FIG. 3, it is shown as being connected to the Wegstein solver 348 and/or the Newton solver 350. The Wegstein solver 348 and the Newton solver 350 include functionality to combine a production model for several sub-networks to create a production result that may be used to plan an oilfield network, optimize flow rates of wellsites in an oilfield network, and/or identify and address faulty components within an oilfield network. The Wegstein solver 348 can use an iterative method with Wegstein acceleration.

An oilfield network may be solved by identifying pressure drop (e.g., pressure differential), for example, through use of momentum equations. As an example, an equation for pressure differential may account for factors such as fluid potential energy (e.g., hydrostatic pressure), friction (e.g., shear stress between conduit wall and fluid), and acceleration (e.g., change in fluid velocity). As an example, an equation may be expressed in terms of static reservoir pressure, a flowing bottom hole pressure and flowrate. As an example, equations may account for vertical, horizontal or angled arrangements of equipment. Various examples of equations may be found in a multiphase flow simulator such as the simulator of the PIPESIM™ simulation framework (Schlumberger Limited, Houston, Tex.), which may be implemented for design and diagnostic analysis of oil and gas production systems. As an example, a simulation framework may include one or more modules for building a model; for fluid and multiphase flow modeling; for reservoir, well and completion modeling; for field equipment modeling; and for operations (e.g., artificial lift, gas lift, wax prediction, nodal analysis, network analysis, field planning, multi-well analysis, etc.).

As an example, an equation for a pressure differential (e.g., $\Delta P$) may be rearranged to solve for flow rate (e.g., Q), where the equation may include the Reynolds number (e.g., Re, a dimensionless ratio of inertial to viscous forces), one or more friction factors (e.g., which may depend on flow regime), etc.

Through use of equations for flow into and out of a branch and equating to zero, a linear matrix in unknown pressures may be obtained. As an example, fixed flow branches (i.e., branches in which the flow does not change) may be solved directly for the node pressures.

Thus, as an example, the Wegstein Solver 348 may perform a process as follows: (1) obtain initial estimates for the frictional and elevational resistances from the production models; (2) solve the linear system for the unknown node pressures; (3) calculate resulting flow rates; (4) calculate pressure residuals at each internal node; and (5) determine whether the maximum of the pressure residuals is lower than a specified tolerance. If the maximum pressure residual is not lower than the specified tolerance then the Wegstein solver may continue by a rerun the branches, with the pressure and flows calculated in items (2) and (3) above to re-estimate the branch resistances. Further, Wegstein acceleration may be applied to the resistances before returning to item (2).

In the example of FIG. 3, the Newton solver 344 can implement a Newton-Raphson technique for solving a system of non-linear equations. The Newton-Raphson technique can be applied iteratively for solving a system of non-linear equations defined by a vector of unknown variables and associated residual equations. Following an initial guess, iterations commence, for example, until one or more criteria are met (e.g., number of iterations, error, etc.). Updates for each iteration of the Newton-Raphson technique may be generated by solving a matrix equation that includes a Jacobian matrix formed by differentiating residual equations with respect to the variables. As an example, an adjustable factor may be used to adjust from a pure Newton-Raphson type of update to another type of update.

The Newton solver 344 includes functionality to solve the oilfield network 302 by implementing the Newton method (e.g., as discussed above). Below is an example of how the Newton solver may be used to solve oilfield network 302.

For solving an oilfield network, a process may include: (1) defining variables and residual equations; (2) determine initial solution; (3) calculating residual and Jacobian matrix for each iteration; (4) solve Jacobian equation for the Newton update; (5) optionally determining adjustment factor and (6) updating the solution.

With regards to item (1), defining variables and residual equations, branches in an oilfield network may include a number of equipment items. Each branch may be divided into sub-branches with each sub-branch containing a single equipment item. As an example, a new node may be used to join each pair of sub-branches. In this example, primary Newton-Raphson variables can include a flow ($Q_{ib}$) in each sub-branch in the network and a pressure $P_{in}$ at each node in the network. In this example, temperature (or enthalpy) and composition may be treated as secondary variables.

As an example, residual equations may include a branch residual, an internal node residual, and a boundary condition. In such an example, a branch residual for a sub-branch relates the branch flow to the pressure at the branch inlet node and the pressure at the outlet node. As an example, internal node residuals can define where total flow into a node is equal to total flow out of the node.

As an example, determining an initial solution may be performed using a production model where for each subsequent iteration, a Jacobian matrix is calculated. The values of the Jacobian matrix may be used to solve a Jacobian equation for the Newton-Raphson update. To solve the Jacobian equation, one or more types of matrix solvers may be used.

In the example of FIG. 3, the one or more data sources 306 include one or more types of repositories for data. For example, the one or more data sources 306 may be Internet sources, sources from a company having ties to the oilfield network 302, or any other location in which data may be obtained. The data may include historical data, data collected from other oilfield networks, data collected from the oilfield network being modeled, data describing environmental or operational conditions.

In the example of FIG. 3, the one or more oilfield applications 308 may be applications related to the production of hydrocarbons. The one or more oilfield applications 308 may include functionality to evaluate a formation, manage drilling operations, evaluate seismic data, evaluate workflows in the oilfield, perform simulations, or perform any other oilfield related function. In the example of FIG. 3, the one or more plug-ins 310 may allow integration with packages such as, for example, a TUFPP model, an OLGA™ model, an Infochem Multiflash model (Infochem Computer Services Ltd., London, UK), an equipment model, etc.

While the example of FIG. 3 shows the oilfield production tool 304 as a separate component from the oilfield network 302, the oilfield production tool 304 may alternatively be part of the oilfield network 302. For example, the oilfield production tool 304 may be located at one of the wellsites (e.g., the wellsite 1 312, the wellsite n 314, etc.), at the processing facility 320, or any other location in the oilfield network 302. As another example, the oilfield production tool 304 may exist separate from the oilfield network 302, such as when the oilfield production tool 304 is used to plan the oilfield network.

Various types of numerical solution schemes may be characterized as being explicit or implicit. For example, when a direct computation of dependent variables can be made in terms of known quantities, a scheme may be characterized as explicit. Whereas, when dependent variables are defined by coupled sets of equations, and either a matrix or iterative technique is implemented to obtain a solution, a scheme may be characterized as implicit.

As an example, a scheme may be characterized as adaptive implicit ("AIM"). An AIM scheme may adapt, for example, based on one or more gradients as to one or more variables, properties, etc. of a model. For example, where a model of a subterranean environment includes a region where porosity varies rapidly with respect to one or more physical dimensions (e.g., x, y, or z), a solution for one or more variables in that region may be modeled using an implicit scheme while an overall solution for the model also includes an explicit scheme (e.g., for one or more other regions for the same one or more variables).

As an example of an AIM scheme, consider an AIM scheme available as part of the ECLIPSE™ 300 reservoir simulator marketed by Schlumberger Ltd. (Houston, Tex.). The ECLIPSE™ 300 reservoir simulator may implement a fully implicit scheme or an implicit-explicit scheme that is implicit in pressure and explicit in saturation, known as IMPES. In the fully implicit scheme, values for both pressure and saturation are provided at the end of each simulation time-step; whereas, the IMPES scheme uses saturation values from the beginning of the time-step to solve for pressure values at the end of the time-step. In such examples, a reservoir simulator iterates until pressures values in grid blocks of a model of the reservoir being simulated have reached some internally consistent solution. However, a solution may be difficult to find if saturation (which the IMPES scheme assumes is constant within a time-step) changes rapidly during that time-step (e.g., a large percentage change in grid block values for saturation). The IMPES scheme may be able to cope with such an issue by decreasing "length" (e.g., duration) of the time-step but at the cost of more time-steps (e.g., in an effort to achieve a more stable solution).

The aforementioned fully implicit scheme may be a more stable option with saturation and pressure being obtained simultaneously so as any difference between their values for one time-step and a next time-step does not disturb a solution process as much as when compared to the IMPES scheme. Thus, in a fully implicit scheme, the "length" (e.g., duration) of a time-step may be larger but it also means that the fully implicit scheme may take additional processing time to achieve solutions (e.g., in comparison with an IMPES scheme). However, in a reservoir where properties change rapidly, a fully implicit scheme may provide a solution in less computational time than an IMPES scheme, even though an iteration of the fully implicit scheme may take longer to complete when compared to an iteration of the IMPES scheme.

The aforementioned ECLIPSE™ 300 reservoir simulator may also implement one or more modules such as a black-oil simulator module, a compositional simulator module, or a thermal simulator module (e.g., for simulating thermodynamics, etc.). As an example, a black-oil simulator module may include equations to model three fluid phases (e.g., oil, water, and gas, with gas dissolving in oil and oil vaporizing in gas); as an example, a compositional simulator module may include equations to model phase behavior and compositional changes; and, as an example, a thermal simulator module may include instructions (e.g., for equations, etc.) to model a thermal recovery processes such as steam-assisted gravity drainage (SAGD), cyclic stream operations, in-situ combustion, heater, and cold heavy oil production with sand. As an example, one or more thermal modules may provide instructions for modeling and simulating multiple hydrocarbon components in both oil and gas phases, a single non-volatile component in an oil phase, oil, gas, water, and solids behaviors (e.g., optionally with chemical reactions), well production rates based on factors such as well temperature, low-temperature thermal scenarios (e.g., experiments or cold heavy oil production with sand), toe-to-heel air injection scenarios, foamy oil (e.g., as to effect on gas production, gas drive, oil production, etc.), multisegmented well models (e.g., optionally including dual-tubing, horizontal wells, multiphase flow effects in a wellbore, etc.).

As to network models, as an example, a method can include simulation of steady state operation of an oil and gas production system over various ranges of operating conditions and configurations. In such an example, the method may include an implicit evaluation of conservation of energy equations in addition to mass and momentum as an effective technique for efficiently and robustly simulating the production system where, for example, the production system includes fluid such as heavy oil, steam or other fluids at or near critical pressures or temperatures. The term "critical point" is sometimes used herein to specifically denote a vapor-liquid critical point of a material, above which distinct liquid and gas phases do not exist.

As mentioned, a production system can provide for transportation of oil and gas fluids from well locations along flowlines which are interconnected at junctions to combine fluids from many wells for delivery to a processing facility. Along these flowlines (including at one or more ends of a flowline), production equipment may be inserted to modify the flowing characteristics like flow rate, pressure, composition and temperature. As an example, a boundary condition may depend on a type of equipment, operation of a piece of equipment, etc.

As an example, a simulation may be performed using one type of equipment along a flowline and another simulation may be performed using another type of equipment along the same flowline, for example, to determine which type of equipment may be selected for installation in a production system.

As an example, a simulation may be performed using one type of equipment at a position (e.g., with respect to a flowline) and another simulation may be performed using another type of equipment at a different position (e.g., with respect to the same flowline or a different flowline), for example, to determine which type of equipment may be selected for installation in a production system as well as to determine where a type of equipment may be installed. As an example, a simulation may be performed using one type of equipment at a position (e.g., with respect to a flowline) and another simulation may be performed using that type of equipment at a different position (e.g., with respect to the same flowline or a different flowline), for example, to determine where that type of equipment may be installed.

Figure 4:
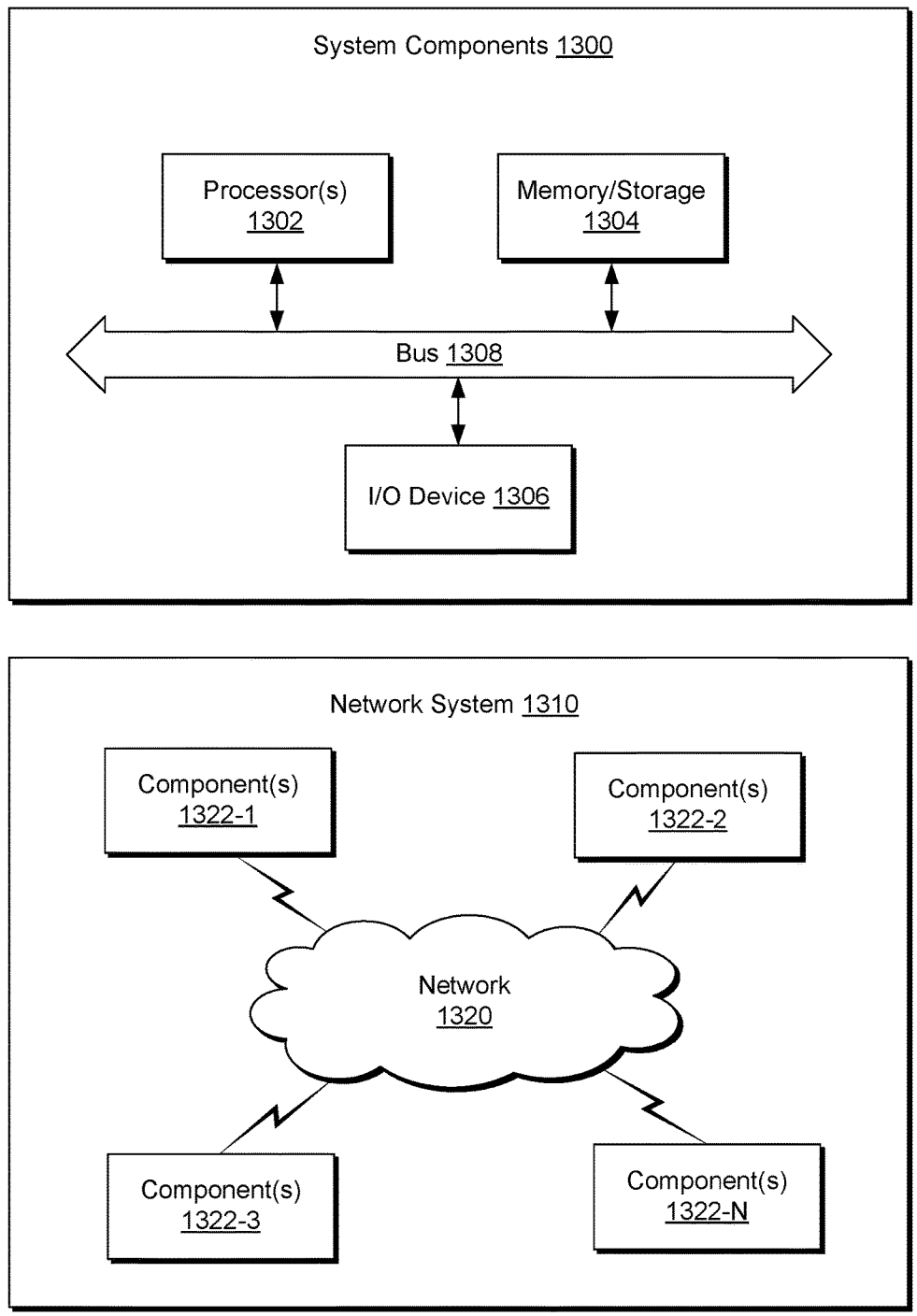
FIG. 4 illustrates an example of a network, an example of a system and examples of modules.

FIG. 4 shows an example of a relatively small production system network 410 (e.g., optionally a portion of a larger network 401), an example of a system 450 and examples of modules 470. As shown, the network 410 forms somewhat of a tree like structure where flowlines represent branches (e.g., segments) and junctions represent nodes. As shown in FIG. 4, the network 410 provides for transportation of oil and gas fluids from well locations along flowlines interconnected at junctions with final delivery at a central processing facility.

In the example of FIG. 4, various portions of the network 410 may include conduit. For example, consider a perspective view of a geologic environment 403 that includes two conduits which may be a conduit to Man1 and a conduit to Man3 in the network 410. The conduits may be specified at various points by characteristics, which may be characteristics of the environment, characteristics of the conduits, characteristics of fluid in the conduits, etc. For example, consider conduit elevation, which may allow for determination of conduit inclination. As an example, consider conduit cross-sectional flow area, which may be defined by one or more parameters such as, for example, a conduit diameter. As an example, consider fluid that may flow in a conduit where the fluid may be characterized at least in part by a property such as, for example, viscosity (see, e.g., the ternary diagram 250 and the table 260 of FIG. 2 and approaches to multiphase properties, etc.). As an example, thermal conditions may optionally be considered such as, for example, latent heat, heat transfer, etc. As an example, thermal conditions may depend on insulation of equipment, temperature of an environment, wind, sun, rain, snow, etc. Such factors may be considered when assessing an existing network, developing a network, extending a network, etc.

As an example, given information of operating condition(s) at boundary nodes (e.g., where fluid enters and exists the system) and the physical environment between them (e.g., geographical location, elevation, ambient temperature, etc.), a production engineer may aim to design a production system that meets business and regulatory requirements constrained to operating limits of available equipment.

As an example, a method can include implementing one or more modules to simulate steady state operation of a production system, for example, as including a network (e.g., as a sub-network, etc.) as in the example of FIG. 4 (also see, e.g., FIG. 1). Such a method may include simulating the steady state operation over a selected range of operating conditions and configurations (e.g., optionally a broadest reasonable range).

As an example, to model the network 410, a set of equations can include terms for conservation of momentum, conservation of mass and conservation of energy. In such an example, a set of implicit variables may be formulated, for example, where the following are implicit: pressure P at each node, flow rate Q in each branch and temperature T at each node. In such an example, two intermediate variables may be defined as follows: composition C as a function of Q and enthalpy H as a function of P and T.

As an example, an approach that provides flexibility as to treatment of enthalpy/temperature as implicit variables may optionally be applied in situations where, for example, one or more fluids such as heavy oil, water, steam, etc. are present and, for example, where pressure/temperature for one or more fluids are near a critical point (e.g., a vapor-liquid critical point of fluid, above which distinct liquid and gas phases do not exist). To provide enthalpy/temperature flexibility, conservation equations may be defined (e.g., for a Jacobian matrix).

As an example, equipment may be modeled as being adiabatic (e.g., adiabatic devices), for example, on the basis that equipment lengths are substantially smaller than pipe lengths and that heat loss over such equipment can be suitably considered as being negligible. However, for compressors and pumps, a formulation can optionally consider heat gain as a result of loss of total efficiency (e.g., based on manufacturer specifications for efficiency with respect to operational conditions, etc.).

As an example, for instances without an explicit formula for change of enthalpy with respect for pressure and temperature, it is possible to implement one or more flash algorithms provided as a package or packages, for example, to calculate numerical derivatives. As an example, a formulation and solution process may include implementing one or more flash packages that include features to calculate one or more analytical derivatives.

As explained, a production system may provide for transportation of oil and gas fluids from well locations to a processing facility and can represent a substantial investment in infrastructure with both economic and environmental impact. Simulation of such a system, which may include hundreds or thousands of flow lines and production equipment interconnected at junctions to form a network, can be complex and involve multiphase flow science and engineering and mathematical methods to provide solutions (e.g., by solving large systems of non-linear equations). Factors associated with solid formation, corrosion and erosion, and environmental impact may increase complexity and cost.

As an example, a method can include formulating a proxy (e.g., or surrogate) model that may be suitable for expediting network analysis. Such a method may, for example, be implemented via a computing system.

As shown in FIG. 4, the example system 450 includes one or more information storage devices 452, one or more computers 454, one or more networks 460 and one or more modules 470. As to the one or more computers 454, each computer may include one or more processors (e.g., or processing cores) 456 and memory 458 for storing instructions (e.g., modules), for example, executable by at least one of the one or more processors. As an example, a computer may include one or more network interfaces (e.g., wired or wireless), one or more graphics cards, a display interface (e.g., wired or wireless), etc. As an example, imagery such as surface imagery (e.g., satellite, geological, geophysical, etc.) may be stored, processed, communicated, etc. As an example, data may include SAR data, GPS data, etc. and may be stored, for example, in one or more of the storage devices 452. As an example, information that may be stored in one or more of the storage devices 452 may include information about equipment, location of equipment, orientation of equipment, fluid characteristics, etc.

As an example, the one or more modules 470 may include instructions (e.g., stored in memory) executable by one or more processors to instruct the system 450 to perform various actions. As an example, the system 450 may be configured such that the one or more modules 470 provide for establishing a framework, for example, that can perform network modeling. As an example, one or more methods, techniques, etc. may be performed using one or more modules, which may be, for example, one or more of the one or more modules 470 of FIG. 4.

FIG. 4 shows example modules 470 as including a graphical user interface (GUI) module 471, a map module 472, an equipment module 473, a data module 474 (e.g., for measured data, synthetic data, etc.), a proxy/surrogate model(s) module 475, and one or more other modules 476.

As an example, one or more modules may include instructions to instruct a system to render terrain and equipment locations to a display (e.g., via the GUI module 471, the map module 472, the equipment module 473, etc.); receive data for at least a portion of a network (e.g., via the module 474); analyze the data with respect to a proxy model associated with the terrain and the equipment locations (e.g., via the module 475); and render information to the display based at least in part on an analysis (e.g., via the GUI module 471, a report module, etc.).

As an example, a framework may be implemented using various features of a system such as, for example, the system 450 of FIG. 4. As an example, one or more modules may be provided that include instructions that may be executed by a processor or processors. As an example, instructions may be provided for execution of instructions in parallel, for example, to consider multiple features of a network or networks that may be associated with a geologic environment such as the geologic environment 110 of FIG. 1.

As an example, a method can include defining a proxy (e.g., or surrogate) to model multiphase flow. Such a method can utilize existing data and/or synthetic data that may mimic more complex multiphase flow behavior, for example, as may be described by one or more mechanistic multiphase flow models. A proxy approach can be rapid and flexible, for example, as to optimization of one or more surface networks. As an example, a proxy approach may be implemented in an automated or semi-automated manner for optimization of one or more surface networks. As an example, a proxy approach may be implemented in a stand-alone manner, in a coupled manner with one or more reservoir(s) and/or process facilities, etc.

As an example, a proxy may be implemented to mimic one or more complex models for rapid and robust optimization of one or more surface networks. In such an example, once an acceptable solution has been generated, the solution may be implemented to solve at least one more complex model, for example, to validate design of one or more surface networks, to verify design of one or more surface networks, etc.

As an example, a proxy approach may include a drift-flux model; noting that one or more other types of models are suitable for such a proxy approach.

As an example, drift-flux may represent a class of models of multiphase flows, for example, in which relative motion between phases is governed by a particular subset of flow parameters. In a two component example, for components A and B, volumetric fluxes $j_A$ and $j_B$ may be related to a total volumetric flux, j, a "drift-flux" $j_{AB}$ and volume fraction by, for example, $j_A = \alpha j + j_{AB}$; $j_B = (1-\alpha)j - j_{AB}$. In a drift-flux model, forces on individual phases may be determined to relative motion, which may involve solution of momentum and energy equations. However, drift-flux models may be implemented where dominant relative motion is caused by an ascertainable force such as, for example, gravity. In such an example, a function (e.g., a proxy) may approximate motion based on that force, volume fraction(s), and physical properties (e.g., densities, viscosities, etc.).

Automated optimization tools for delineating and designing optimum well placement for sub-surface asset exploitation exist. Such automated (or semi-automated) algorithms are likely to include optimization of a gathering network(s) where accurate and robust multiphase flow modeling is desired. If such a model is not suitably accurate, then the optimized solution may be suspect as it may possibly include one or more flaws. As an example, where a model is not sufficiently robust, automated optimization may fail and waste time and resources; noting that an incorrect solution may lead to one or more erroneous decisions, which could have possible negative repercussions.

As an example, a proxy approach can include an effective, multiphase flow model that is responsive to various selected parameters. For example, consider the following selected parameters: conduit inclination, fluid viscosity, fluid density, conduit diameter/geometry, fluid phases and flow rates. With reference to FIG. 4, as mentioned, conduit elevations may be known and used to estimate one or more inclinations and/or one or more declinations (e.g., negative inclinations). As an example, where information concerning weather, sun, shadow, etc. are known, one or more environmental conditions of a conduit, a piece of equipment, etc. may be estimated. For example, a conduit on a south facing slope of a hill may be exposed to greater sunlight than a conduit on a north facing slope of a hill (e.g., depending on latitude, weather, etc.). Such factors may influence temperature of fluid in a conduit and, for example, have an effect on one or more of fluid viscosity, fluid phases, flow rate, etc.

Two examples are presented below that demonstrate proxy approaches. One example includes considers a drift-flux model suitable for various pipe inclinations and the other example considers a flexible form of a stratified flow model coupled to an upward drift-flux model.

As an example, one or more workflows may include a proxy approach. As an example, a proxy (e.g., or surrogate) approach can include a proxy (e.g., or surrogate) model that is based on data that can mimic one or more other, more complex and expensive (in terms of computation-time) models. As an example, a proxy (e.g., or surrogate) model may be customizable, for example, to suit available data or, for example, to mimic relevant data obtained from one or more other sources. As an example, a proxy approach may model multiphase flow in one or more conduits (e.g., consider two- and three-phase flows).

As an example, a "proxy" may be a model that attempts to mimic actual data while a "surrogate" may be a model that attempts to mimic another model (e.g., more than data). As an example, the term "proxy" may be used generally to include "surrogate".

As an example, a method can include coupling components of a hydrocarbon flowing system. For example, consider an approach that couples of flow of fluid in porous media of a reservoir, flow of fluid in a wellbore, and flow of fluid at a well head, which may be part of a multi-branched conduit gathering network. As an example, from a gathering node, fluid may be transported to one or more additional gathering nodes (e.g., for export, into a process facility, etc.).

Example Proxy Approach

As an example, consider a proxy approach that involves a drift velocity model (e.g., a type of drift-flux model) that can model various pipe inclinations:

$$(u_{dr})_{New} = m_1 (u_{dr}^V) \sin(\theta) + m_2 (u_{dr}^H) \cos(\theta) \quad (1)$$

For the drift velocity model, $(u_{dr})_{New}$ represents a new/revised vertical drift velocity with two primary components, for example, $u_{dr}^H$ being a horizontal drift velocity and $u_{dr}^V$ being the vertical drift velocity. In the model, $\theta$ represents a conduit inclination, for example, where horizontal flow is at 0 degrees, vertical upward flow is at +90 degrees and vertical downward flow is at −90 degrees (e.g., aligned with gravity). In the model, $m_1$ and $m_2$ are dimensionless multipliers (e.g., to be determined from optimization).

Eq. (1) can be expanded to reveal parameters that may be used for model optimization. An expansion may yield the following, collectively, Eq. (2) and Eq. (3) for $m_1$ and $m_2$ terms, respectively:

$$(u_{dr})_{New} = m_1 \left\{ \frac{\left(1 - \alpha_G \cdot \frac{A}{1 + (A-1)\left(\frac{\beta - B}{1 - B}\right)^2}\right) \left(\frac{A}{1 + (A-1)\left(\frac{\beta - B}{1 - B}\right)^2}\right) x_{[@\alpha_G]} u_{ch.}}{\alpha_G \cdot \frac{A}{1 + (A-1)\left(\frac{\beta - B}{1 - B}\right)^2} \sqrt{\frac{\rho_G}{\rho_L}} + 1 - \alpha_G \cdot \frac{A}{1 + (A-1)\left(\frac{\beta - B}{1 - B}\right)^2}} \right\} \sin(\theta) +$$

$$m_2 \left\{ \left\{ \sqrt{gD} \left[ \left( C_1 - C_2 \left[ \frac{(N_\mu)^{C_3}}{(N_{E\delta})^{C_4}} \right] \right) \left( \alpha_G^{C_5} [1 - \alpha_G]^{C_6} \right) \right] \right\} \cos(\theta)$$

The foregoing equation, particularly, Eq. (2), includes parameters, defined by $Y_p$, which are suitable for optimization, as expressed by Eq. (4):

$$Y_p = \left[ \underbrace{u_{dr}^V}_{A, B, a_1, a_2}, \underbrace{u_{dr}^H}_{C_1, C_2, C_3, C_4, C_5, C_6}, m_1, m_2 \right]^T \quad (4)$$

In Eq. (2), the definition and specification of $\varkappa_{[@\alpha_G]}$, which may be the critical Kutateladze number as a function of gas hold-up, is described further below.

Example Parameter Fitting

As an example, an approach may perform some form of optimization about the parameters of Eq. (4) to obtain a representative set (or sets) of $Y_p$ for different inclinations and fluid types. For example, an analysis of 3000 data points furnished the following parameters, expressed as Eq. (5) below:

$$Y_p = \begin{bmatrix} \frac{A}{1.0758,} & \frac{B}{0.2922,} \\ \frac{a_1}{0.2169,} & \frac{a_2}{0.4118,} & \frac{C_1}{0.7943,} & \frac{C_2}{1.7599,} & \frac{C_3}{0.4622,} & \frac{C_4}{0.5610,} & \frac{C_5}{1.0024,} & \frac{C_6}{0.1274,} \\ \frac{m_1}{1.1974,} & \frac{m_2}{1.0} \end{bmatrix}^T$$

Example Closure Relationships

As an example, Eq. (6) and Eq. (7), presented below, may provide values as in Table 1, below.

TABLE 1

Table of critical Kutateladze numbers, Eq. (6), as a function of $\hat{D}$, Eq. (7).

| $\hat{D}$ | $\varkappa_{[@\alpha_G]} = f(\hat{D})$ |
|---|---|
| 2 | 0.0 |
| 4 | 1.0 |
| 10 | 2.1 |
| 14 | 2.5 |
| 20 | 2.8 |
| 28 | 3.0 |
| 50 | 3.2 |

Parameters $\alpha_1$ and $\alpha_2$ shown in Eq. (5) are included in the critical Kutateladze number, $\varkappa_{[@\alpha_G]}$, which may be given by Eq. (6):

$$\varkappa_{[@\alpha_G]} = \begin{cases} \frac{1.53}{C_0} = \frac{1+(A-1)\left(\frac{\beta-B}{1-B}\right)^2}{1.53 \times A} & \text{when } \alpha_G \leq a_1 \\ \varkappa_{[@\alpha_G=a_1]} + \left(\varkappa_{[@\alpha_G=a_2]} - \varkappa_{[@\alpha_G=a_1]}\right)\left(\frac{\alpha_G - a_1}{a_2 - a_1}\right) & \text{if } a_1 < \alpha_G < a_2 \\ f(\hat{D}) & \text{when } \alpha_G \geq a_2 \text{ per Table 1} \end{cases}$$

In Eq. (6), $\hat{D}$ may be given by Eq. (7):

$$\hat{D} = D \times \sqrt{\frac{g(\rho_L - \rho_G)}{\sigma_{G-L}}} \quad (7)$$

As an example, the characteristic velocity, $u_{ch.}$, in Eq. (2) may be given by Eq. (8):

$$u_{ch} = \left(\frac{\sigma_{G-L} g(\rho_L - \rho_G)}{\rho_L^2}\right)^{\frac{1}{4}} \quad (8)$$

As an example, the profile parameter, $C_0$, may be given by Eq. (9):

$$C_0 = \frac{A}{1 + (A-1)\gamma^2} \quad (9)$$

As an example, A is a parameter suitable for optimization while may be given by Eq. (10):

$$\gamma = \frac{\beta - B}{1 - B} \text{ subject to limits } 0 \leq \gamma \leq 1 \quad (10)$$

In the example Eq. (10), B is a parameter suitable for optimization; noting that $\beta \to 1.0$ as $\alpha_G \to 1.0$ and also as the mixture velocity, $u_{mix}$, approaches a relatively high value. As an example, $\beta$ may be defined by Eq. (11):

$$\beta = \max\left(\alpha_G, F_\nu \frac{\alpha_G |u_{mix}|}{(u_G^s)_{flood}}\right) \quad (11)$$

As an example, the flooding velocity in Eq. (11) may be given by Eq. (12):

$$(u_G^s)_{flood} = (u_{ch})\varkappa_{[@\alpha_G]}\sqrt{\frac{\rho_L}{\rho_G}} \quad (12)$$

In Eq. (12), the velocity of a bubble, $u_G^s$, rising through a stagnant liquid column (e.g., consider a subscript [@$u_L$=0]). As an example, the flooding velocity fraction may be kept constant, namely $F_\nu$=1.0.

As an example, the Eötvös number, $N_{E\ddot{o}}$ (e.g., proportional to buoyancy force divided by surface tension force), and viscosity number, $N_\mu$, may be given by Eq. (13a) and Eq. (13b) as follows:

$$(N_{E\ddot{o}}) \equiv \frac{(\rho_L - \rho_G)gD^2}{\sigma_{G-L}} \quad (13a)$$

$$(N_\mu) \equiv \frac{\mu_L}{(\rho_L - \rho_G)D^{3/2}\sqrt{g}} \quad (13b)$$

In $N_\mu$ (Eq. (13b)), $\mu L$ is the liquid viscosity, in $N_{E\ddot{o}}$ (Eq. (13a)) $\sigma_{G-L}$ is the interfacial surface tension of the gas/liquid interface, and D is a hydraulic diameter of a conduit.

As mentioned with respect to the ternary diagram 250 and the table 260 of FIG. 2, a liquid viscosity may be defined as the oil phase viscosity, the water phase viscosity or a mixture of viscosities of both phases, for example, weighted using void fractions of water and oil where the sum of their void fractions equals unity. As mentioned, surface tension may be defined for gas and liquid (e.g., either oil or water); whereas, for two-phase liquid-liquid flow (e.g., oil and water), surface tension may represent the interfacial tension between oil and water as adjacent fluid types. Density may be determined, for example, as discussed above with respect to the table 260 of FIG. 2.

As an example, a method can include solving for $\alpha_G$, for example, using a formulation such as Eq. (14)

$$0 = \frac{u_G^s}{C_0(\alpha_G; Y_p)u_{mix} + (u_{dr}^G)_{New}(\alpha_G; Y_p)} - \alpha_G \quad (14)$$

Eq. (14) can apply to gas-liquid flow (e.g., subscript "G"). For example, consider liquid as being oil/water where the numerator represents the oil-phase. In Eq. (14), $u_G^s$ is the superficial velocity of the gas phase in a two-phase gas-liquid multiphase flow scenario. The definition and meaning of $Y_p^F$ is described further below. As an example, a method can include computing a parameter set as represented by $Y_p^F$. For example, such a parameter set may be used as a surrogate to more complex models.

In the example Eq. (14), an implicit function is set forth about $\alpha_G$, which is a desired hold-up fraction, which may then be used (e.g., if desired) in one or more friction-drop calculations, etc.

Example Parameter Functions

As an example, a method can include defining model parameters such that they, themselves, represent an optimized value for that parameter for a specific input condition. In such an example, a proxy (e.g., or surrogate) response surface to one or more complex models may be generated.

As an example, a method can include defining a set of parameters for a multiphase flow model. In such an example, one or more functions may be used where, for example, a function is a function of one or more parameters. Such an approach can add flexibility and can be robust, for example, when compared to a "fixed" parameter approach. As an example, function parameters can include one or more of diameter, inclination, viscosity and density. As an example, a method can include defining functions via optimization using one or more data sets.

As an example, a method can include receiving information where the information includes data. For example, a method can include receiving one or more types of data such as measured data, experimental data, estimated data, synthetic data, etc.

Referring again to the parameter set specified in Eq. (4), namely:

$$Y_p = [A, B, a_1, a_2, C_1, C_2, C_3, C_4, C_5, C_6, m_1, m_2]^T$$

As an example, a method can include solving for values of parameters of the parameter set where such solving aims to make individual parameters optimal, for example, responsive, to particular independent variables. Such independent variables may include, for example, one or more of inclination, conduit diameter/geometry, viscosity and density. As an example, viscosity may be included where an approach aims to model heavy oil(s).

As an example, to automate a surface network, quality of a multiphase model that is implemented can impact determination of a good, near-optimal, solution. In such an example, a proxy (or surrogate) model may be generated for a mechanistic multiphase flow model where a solution based on the proxy model may provide for a more accurate determination of a solution for purposes of automating a surface network.

As an example, time constraints may exist where time to deploy (e.g., utilize) one or more complex multiphase flow models is limited. In such an example, a proxy approach may aim to obtain one or more reasonable solutions in a reasonable amount of time. While complex mechanistic multiphase flow models may be implemented at a design stage of engineering, when faced with a large solution space, as an example, a proxy approach may allow for traversing the solution space in a timely manner to obtain (e.g., locate) a solution or solutions suitable for decision making (e.g., further analysis). In such an example, the proxy (or surrogate) to a complex (computationally-intensive) mechanistic multiphase flow model may be implemented in one or more workflows.

As an example, an automated (or semi-automated) surface network design tool may implement one or more proxies to arrive at a number of reasonable solutions. For example, consider solutions that specify different possible conduit diameters, conduits traversing different terrains (see, e.g., FIG. 4), etc. A proxy approach may, for example, model fluids, such as heavy oils. As an example, a proxy approach may be implemented where a network includes mixing of different fluid types in the network prior to the mixture entering a process facility.

As an example, an optimization technique may include a proxy where the proxy increases robustness, which may be defined as an ability to avoid failure, poor results, etc. As an example, a flow-regime-independent model may be implemented as part of an optimization workflow to be robust and unlikely to fail due to numerical divergences or "holes" in the solution; noting that such "holes" may appear in more complex models, which may impact optimization.

Example of Using Data to Define a Proxy/Surrogate

As an example, an approach can consider that the coefficients of $Y_p$ are, themselves, constructed of functions (e.g., polynomials, linear functions, splines, etc.) dependent on variables likely to impact results, such as inclination angle ($\theta$), diameter, D and viscosity $\mu$.

As an example, a method can include defining a set of generalized function-dependent parameters, $Y_p^F$, as shown in Eq. (15):

$$Y_p^F = \left[ \underset{\mathcal{V}_1}{\overset{=A}{}}, \underset{\mathcal{V}_2}{\overset{=B}{}}, \underset{\mathcal{V}_3}{\overset{=a_1}{}}, \underset{\mathcal{V}_4}{\overset{=a_2}{}}, \underset{\mathcal{H}_1}{\overset{=C_1}{}}, \underset{\mathcal{H}_2}{\overset{=C_2}{}}, \underset{\mathcal{H}_3}{\overset{=C_3}{}}, \underset{\mathcal{H}_4}{\overset{=C_4}{}}, \underset{\mathcal{H}_5}{\overset{=C_5}{}}, \underset{\mathcal{H}_6}{\overset{=C_6}{}}, \underset{\mathcal{M}_1}{\overset{=m_1}{}}, \underset{\mathcal{M}_2}{\overset{=m_2}{}} \right]^T \quad (15)$$

In Eq. (15), $v_i$ is used to denote functions applicable to $u_{dr}^V$ (vertical drift velocity) and $\mathcal{H}_i$ is used to denote functions applicable to $u_{dr}^H$ (horizontal drift velocity). Dimensionless multipliers, which reside outside both drift models, may be denoted by $\mathcal{M}$. Such functions can represent optimum parameter values for one or more input variables.

As an example, an approach may be implemented in a method involving automated and optimal surface network design.

As an example, consider generalization of parameter behavior to respond to one or more selected independent variables. As an example, consider selection of one or more of: inclination angle ($\theta$), conduit diameter, D and viscosity $\mu$. Such variables may be primary variables and denoted, for example, as: $\xi \in \{\theta, D, \mu, \ldots\}$. In such an example: $\xi_1 = \theta$, $\xi_2 = D$, $\xi_3 = \mu, \ldots, \xi_n = x$, where x is another one of the selected primary variables (n).

As an example, a method can include devising a model to mimic a more complex model. For example, consider devising a proxy (e.g., or surrogate) for a mechanistic multiphase flow model. As an example, a method can include generating a quantity of synthetic data corresponding to various input conditions to be covered in an analysis. In such an example, the method may then optimize model parameters to the data. As an example, such an approach may be applied to multiphase flow. As an example, an approach may include devising a proxy (e.g., or surrogate) for one or more particular fluids (e.g., consider naphtha, etc.).

As an example, a method can include receiving information and populating a solution space using at least a portion of the received information (e.g., data). In such an example, the method can include defining functions. For example, consider defining functions acting as proxies for optimal parameters. Such an approach may be represented, for example, by Eq. (16):

$$v_j \text{ or } \mathcal{H}_j \text{ or } \mathcal{M}_j \rightarrow f(\xi \in \{\theta, D, \mu, \ldots\}; (\lambda_j)_{k \in \{0, \ldots, n\}}, (\eta_j)_{k \in \{0, \ldots, n\}}, \ldots) \quad (16)$$

where $\xi$ is a set of independent variables (e.g., inclination angle ($\theta$), conduit diameter, D and viscosity $\mu$, etc.).

The Eq. (16) is made general, for example, by specifying general function parameters: $(\lambda_j)_{k \in \{0, \ldots, n\}}$ and $(\eta_j)_{k \in \{0, \ldots, n\}}$, where each may include k elements. As an example, fewer or more parameters may be included in a formulation. As an example, one or more piece-wise functions (e.g., with smooth transitions) may be specified (see, e.g., examples further below).

With a drift-flux model as an example, Eq. (15) set into Eq. (14) can establish a function for (implicit) hold-up, $\alpha_G$, for example, per Eq. (17):

$$0 = \frac{u_G^s}{C_0(\alpha_G; Y_p^P) u_{mix} + (u_{dr}^\theta)_{New}(\alpha_G; Y_p^P)} - \alpha_G \quad (17)$$

In Eq. (17), $Y_p^F$ is employed rather than $Y_p$ as stated earlier in Eq. (14). Such an approach, for example, involves tuning $Y_p^F$ to act as a proxy (e.g., or surrogate) for a complex, mechanistic, multiphase flow model.

Example Algorithm(s)

Figure 5:
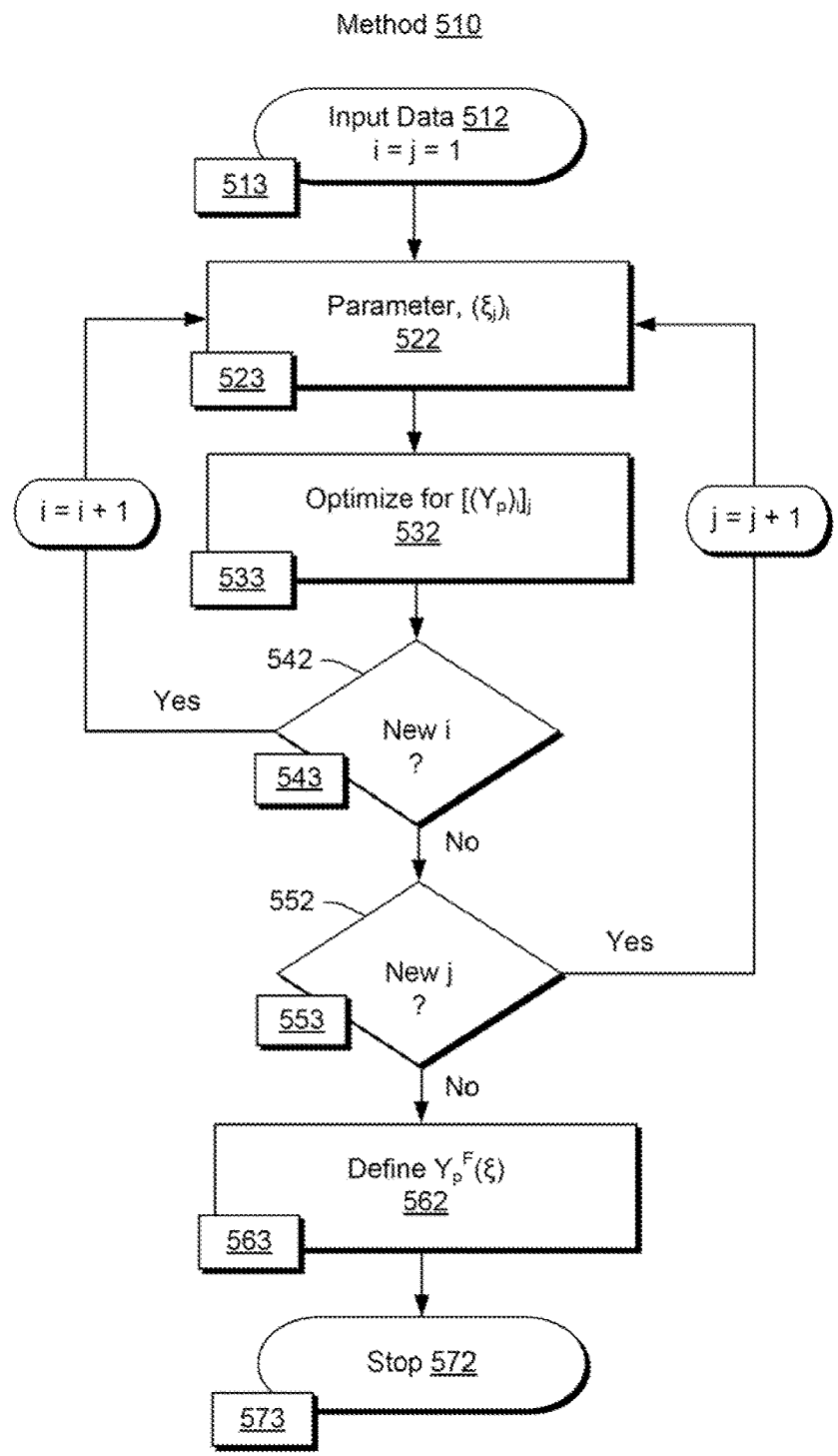
FIG. 5 illustrates an example of a method.

FIG. 5 shows an example of a method 510 that includes an input block 512, a parameter block 522, an optimization block 532, a decision block 542, a decision block 552, a definition block 562 and a termination block 572.

The method 510 is shown in FIG. 5 in association with various computer-readable media (CRM) blocks 513, 523, 533, 543, 553, 563 and 573. Such blocks generally include instructions suitable for execution by one or more processors (or processing cores) to instruct a computing device or system to perform one or more actions. While various blocks are shown, a single medium may be configured with instructions to allow for, at least in part, performance of various actions of the method 510. As an example, a computer-readable medium (CRM) may be a computer-readable storage medium, for example, such as a memory device of a computing device or system. As an example, a computer-readable storage medium or a machine-readable storage medium may be a non-transitory medium that is not a carrier wave.

In the method 510, an index j can represent a primary variable of interest and an index i can represent a value, or range, within $\xi_j$ to determine optimal parameters, hence $[(Y_p)_i]_j$.

As an example, where j=1≡$\theta$, a method can include creating an ensemble of optimal $Y_p$'s for various angles from −90° to +90°, which may provide optimums for Eq. (2). Such an ensemble of optimum parameters may then be used to define a single function which may return an optimum value for $Y_p(\theta)$ for each of the angles evaluated (e.g., consider evaluating a 181 angles using 1 degree intervals).

As an example, where j=2, a method can include producing a 2-dimensional surface of optimums. As an example, where j=3, a method can include generating multiple surfaces, for example, where individual surfaces corresponding to a member of j=3.

In the example of FIG. 5, the method 510 can include computing optimal multiphase flow model parameters for various input variables defined by $\xi_j$ where the index i can represents a value, or range, within to determine optimal parameters. For example, if j=10, and sufficient data exists, the method 510 may include creating an ensemble of optimal $Y_p$'s for individual angles, for example, from about −90° to about +90°. Such an approach may provide, in part, as a solution:

$$[(Y_p)_{i \in \{-90, \ldots, +90\}}]_{j=0}$$

Such a solution (e.g., result) may be optimal and a method can include transforming at least a portion of the solution into, for example, a single function yielding an optimum value for $Y_p$ for a plurality of individual angles. For example, where an angle increment is about 1 degree, given the range of −90 degrees to +90 degrees, 181 angles may be considered where a single function that represents the 181 separate optimum parameter sets covers possible conduit inclinations. As mentioned, where j=2, a method may include generating a 2-dimensional surface of optimums; and where j=3, a method may generate multiple surfaces, for example, where individual ones correspond to individual members of j=3. As an example, a method may include scenarios where j>3. In such an example, a data structure such as a look-up table (LUT) may be implemented with appropriate booking algorithm(s). As an example, a method can include selecting a value for an index based at least in part on an amount and/or type of data available.

Implementation Examples

The example method 510 of FIG. 5 may be implemented, for example, as a workflow. For example, consider a workflow that can generate a single- or multi-dimensional function Y (e.g., as in Eq. (15)). As an example, a method can include one or more primary variables.

Example of Single Primary Variable

As an example, a method may include a single variable. For example, consider conduit inclination angle $\theta$ as a single variable. With respect to the method 510 of FIG. 5, consider defining $\theta$ (i.e., j=1) such that elements such as those of may be derived. In such an example, a range may be selected for angles from about −90 degrees to about +90 degrees at about 1 degree intervals to form a set of 181 angles such that the index i includes 181 members. Given such a scenario, a method can include generating separate functions, for example, one for each member of $Y_p$ into a single master function set $Y_p^F(\theta_i)$.

Figure 6:
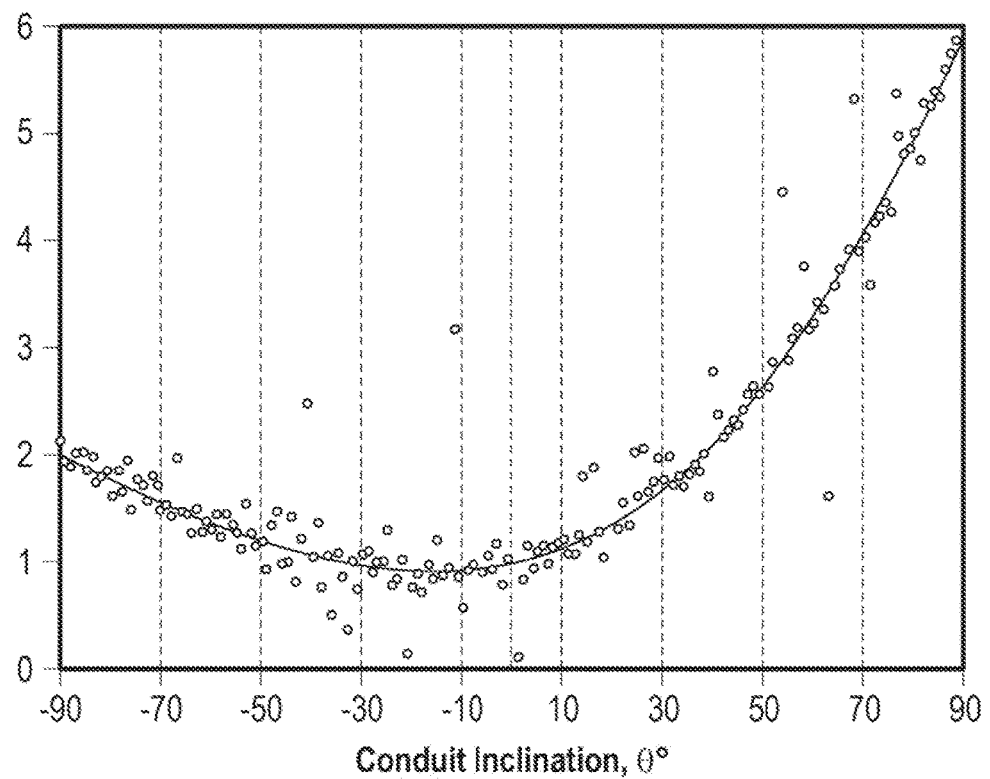
FIG. 6 illustrates an example of a plot.

Given the aforementioned single variable scenario, as an example, a method can include plotting the response of each parameter contained in $Y_p(\theta_i)$ with respect to $\theta$. FIG. 6 shows an example plot 610 where, for example, a curve may be fit to the values (e.g., 181 separate and "optimal" values for the parameter $\theta$, which is a member of $Y_p$). For example, the curve may be a polynomial or other type of function that may suitable be fit to represent a response of optimal values.

Referring again to the example of $Y_p$ as in Eq. (14), note that it includes 12 members. Thus, a method can include generating 12 separate plots such as that of FIG. 6 (e.g., each against $\theta$, which is the primary variable under consideration).

As mentioned, a method can include fitting a function that models optimum values (e.g., to a desired level of fit, etc.). In the example plot 610 of FIG. 6, the line is represented by a 3rd-order polynomial of the form:

$$x(\theta) = \alpha_0 + \sum_{i=1}^{3} \alpha_i(\theta)^i$$

where $\alpha_i \in \{0, 1, 2, 3\}$ are coefficients of the polynomial. As an example, a functional form that best fits the data may be defined and selected. For example, consider one or more of linear functions, polynomials and/or more complex functions that may be dependent on a parameter and independent of another member of $Y_p$. Such an approach can provide flexibility, for example, to capture one or more responses (e.g., mimicking) one or more complex, mechanistic multiphase flow models.

Example of Two Primary Variables

Figure 7:
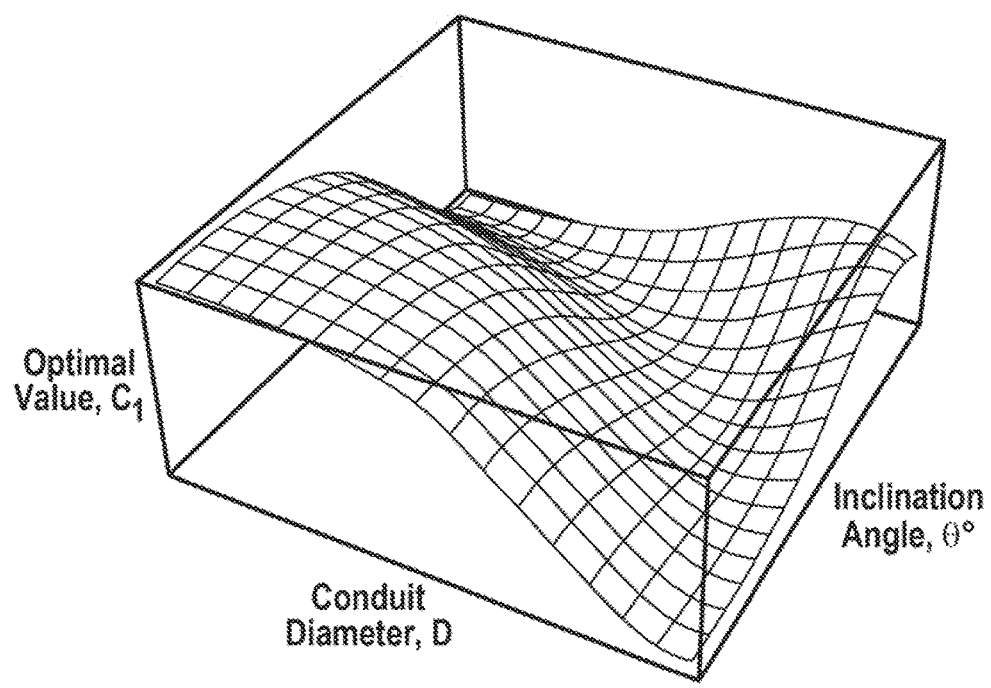
FIG. 7 illustrates an example of a plot.

FIG. 7 shows an example plot 710 for a scenario that includes two primary variables such as, for example, conduit inclination and conduit diameter. The plot 710 shows a surface that represents a best-fit solution to a parameter $C_1$ as a member of $Y_p$. In this example, an appropriate function may be used to define the surface such that it best represents the optimal values of parameters.

The plot 710 shows a range of pipe inclinations from about −90 degrees to about 90 degrees (x-axis) and a range of diameters (y-axis), which define extent of a surface of optimal values for $C_1$ (z-axis).

Example of Three Primary Variables

As an example, three primary variables may be considered such as, for example, conduit inclination (e.g., inclination angle), conduit diameter, and viscosity of a flowing oil-phase $\mu_{oil}$ (e.g., consider two different values of $\mu_{oil}$).

Figure 8:
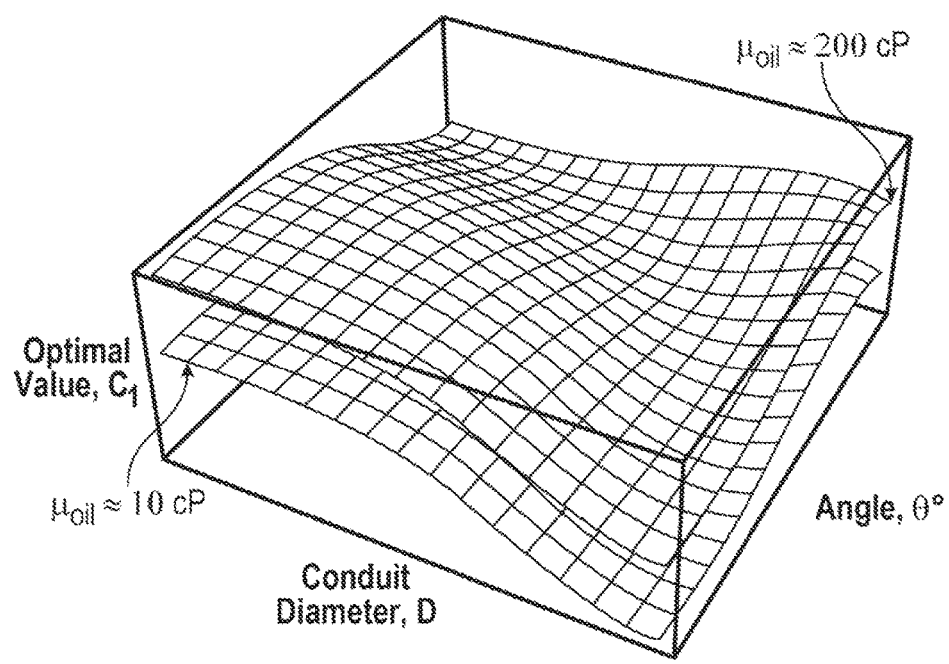
FIG. 8 illustrates an example of a plot.

FIG. 8 shows an example plot 810 that includes two surfaces, one for each of the two different values of $\mu_{oil}$). The two surfaces represent best-fit solutions to the parameter $C_1$ as a member of $Y_p$. In the example of FIG. 8, the lower surface (partially obscured) represents the optimal solution to $C_1$ as a member of $Y_p$ (over values of $\theta$ and D) for oil with a viscosity $\mu_{oil}$ of about 10 cP; whereas, the upper surface represents the optimal solution to $C_1$ as a member of $Y_p$ (over values of $\theta$ and D) for a heavy oil with a viscosity, $\mu_{oil}$ of about 200 cP. The functions defining the surfaces were selected as being capable of suitably representing the optimal values of parameter $C_1$ for the two values of oil viscosity stated. As may be appreciated, the functions may differ. For example, a first function may be selected to represent one value and a second function may be selected to represent another value.

Example for Inclination

As an example, consider, as an input variable, conduit inclination, $\theta$, for example, as generalized above. In such an example, consider data for about 25 different inclinations (e.g., covering a range from vertical downward, horizontal and vertical upward). As an example, one or more inclinations may be represented by a limited number of data points while one or more other inclinations may be represented by more data while yet one or more other inclinations may have a lot of data but of questionable quality.

In an example trial, data were selected from over 15 different sources covering a range of fluid types and diameters. In such an example, a fit for $Y_p^F$ may be impacted by data sparseness. As explained, however, useful results were obtained. As an example, a method may include receiving and/or generating synthetic data, optionally in addition to receiving other types of data.

FIG. 9 shows an example plot 910 and an example plot 930 which include lines that represent fits. For the plot 910, optimal values for B (e.g., as in vertical velocity) as a member of $Y_p$ with respect to $\theta$ are shown as circles where a curve shows a best fit for the function $V_2$ and, for the plot 930, optimal values for $C_1$ (e.g., as in horizontal velocity) as a member of $Y_p$ with respect to $\theta$ are shown as solid filled and circles (upper half) where a curve shows a best fit for the function $\mathcal{H}_1$. In particular, a fifth order polynomial was applied for the plot 910 and three functions were applied for the plot 930 where the functions included smooth transitioning via a Lagrange interpolation scheme.

As an example, a method may aim to furnish functions of optimal parameters for individual members of an equation for $Y_p^F$, for example, as follows:

$$Y_p^F = \left[ \frac{\equiv A}{\mathcal{V}_1}, \frac{\equiv B}{\mathcal{V}_2}, \frac{\equiv a_1}{\mathcal{V}_3}, \frac{\equiv a_2}{\mathcal{V}_4}, \frac{\equiv C_1}{\mathcal{H}_1}, \frac{\equiv C_2}{\mathcal{H}_2}, \frac{\equiv C_3}{\mathcal{H}_3}, \frac{\equiv C_4}{\mathcal{H}_4}, \frac{\equiv C_5}{\mathcal{H}_5}, \frac{\equiv C_6}{\mathcal{H}_6}, \frac{\equiv m_1}{\mathcal{M}_1}, \frac{\equiv m_2}{\mathcal{M}_2} \right]^T$$

In such an example, functions acting as proxies for optimal parameters for each inclination may be generalized as follows per Eq. (18):

$$\mathcal{V}_j \text{ or } \mathcal{H}_j \text{ or } \mathcal{M}_j \rightarrow f(\xi \in \{\theta, D, \mu, \ldots\}; \\ (\lambda_j)_{k \in \{0, \ldots, n\}}, \ldots) \quad (18)$$

where $\xi$ is a set of independent variables. Further generalization may provide a model defined by parameters: $(\lambda_j)_k$ (with k elements) and others, such as, for example, $(\eta_j)_k$; noting that a generalization may be open-ended such that a formulation can include more parameters as may be desired.

As an example, $\xi$ may include a single variable such as, for example, $\theta$ (e.g., consider j=1 in the method 510 of FIG. 5). Where insufficient data exists at a particular juncture (e.g., in time) to expand such an example to include other independent variables, a method may include performing a subsequent analysis where additional data becomes available (e.g., to include one or more other variables, etc.). As an example, where additional data is received, a method can include selecting one or more different functions, refitting, etc.

For functions in Eq. (15), in an example trial, seven of the functions were cast as polynomials, two being linear functions, two being constants while one function (for $\mathcal{H}_1$) being a piece-wise function of three separate functions: a power-law, a polynomial and a linear interpolation which are smoothed with suitable transition functions to ensure smooth transitioning between them (e.g., consider the Lagrange interpolation).

Expressed in terms of θ, a suitable polynomial may include the following general form, presented below as Eq. (19):

$$v_j \text{ or } \mathcal{H}_j \text{ or } \mathcal{M}_j \cong (\lambda_j)_0 + \Sigma_{k=1}^{n}(\lambda_j)_k \times \theta^k \tag{19}$$

where n is the order of the polynomial and $(\lambda_1)_0$ is a constant and $k \in (0, \ldots, n)$. As an example, a method can include defining a maximum value of an order of a polynomial (e.g., consider about 6). As an example, for linear functions, the order may be unity.

As an example, consider the following formulation as Eq. (20):

$$\mathcal{H}_1(\theta; \lambda, \eta) = \begin{cases} \text{power law: } \eta_0 \times \theta^{\eta_1} & \text{for } +0.1° \leq \theta \leq +90° \\ \text{interpolate } \dfrac{(\mathcal{H}_1)_{[\theta=+0.1°]} \text{ and}}{(\mathcal{H}_1)_{[\theta=-1.0°]}} & \text{for } -1.0° \leq \theta \leq +0.1° \\ \text{polynomial } (\lambda)_0 + \sum_{k=1}^{4}(\lambda)_k(\theta)^k & \text{for } -90° \leq \theta \leq -1.0° \end{cases}$$

where the power-law function parameters are: $\eta_0 = 1.340369$ and $\eta_1 = 3.385007 \times 10^{-2}$. The values used for linear interpolation are: $(\mathcal{H}_1)_{[\theta=+0.1°]} = 1.239866$ (i.e., when +0.1 degrees upwards) and $(\mathcal{H}_1)_{[\theta=-1.0°]} = 0.579313$ (i.e., when −1.0 degrees downwards). In this example, the value at horizontal (θ=0 degrees) is $(\mathcal{H}_1)_{[\theta=0°]} = 1.179815$.

Depending of the order of the polynomial, Eq. (19) can represent a single constant value or, for example, up to a sixth-order polynomial. In this example, note that Eq. (19) does not apply to $\mathcal{H}_1$ which is defined in Eq. (20) above and note that Table 2, as shown in FIG. 10, maps $v_j$, $\mathcal{H}_j$ and $\mathcal{M}_j$ to their respective counterparts in Eq. (15) with n values for $(\lambda_j)_k$ (e.g., and also for $(\eta_j)_k$ for $\mathcal{H}_1$).

As an example, Eq. (2) may be written in terms of optimal functions per Eq. (15), as shown below per Eq. (21):

from (a) a complex mechanistic multiphase flow model, and (b) Eq. (17) with parameterization for $Y_p^F$ (e.g., a proxy/surrogate) obtained using Eq. (18) and Table 2. In the example plots 1110 and 1130, error values shown are the residual sum of squares values. In the example plots 1110 and 1130, data are for flow in pipes at inclinations of about 0 degrees, about +5 degrees, about +10 degrees.

FIG. 12 shows an example of a method 1210 that includes a reception block 1212 for receiving information that includes data that correspond to a range of a fluid production network variable; a determination block 1214 for, based at least in part on a portion of the data, determining optimal parameter values of a multi-parameter proxy model for at least a portion of the range of the fluid production network variable; a derivation block 1216 for, based at least in part on a portion of the optimal parameter values, deriving functions for the parameters of the multi-parameter proxy model; and a determination block 1218 for, based at least in part on the functions, determining a value of the fluid production network variable for a fluid production network.

The method 1210 is shown in FIG. 12 in association with various computer-readable media (CRM) blocks 1213, 1215, 1217 and 1219. Such blocks generally include instructions suitable for execution by one or more processors (or processing cores) to instruct a computing device or system to perform one or more actions. While various blocks are shown, a single medium may be configured with instructions to allow for, at least in part, performance of various actions of the method 1210. As an example, a computer-readable medium (CRM) may be a computer-readable storage medium, for example, such as a memory device of a computing device or system. As an example, a computer-readable storage medium or a machine-readable storage medium may be a non-transitory medium that is not a carrier wave.

As shown in FIG. 12, the system 1250 includes one or more computers 1252, one or more storage devices 1255, one or more networks 1256 and one or more modules 1257. As to the one or more computers 1252, each computer may include one or more processors (e.g., or processing cores) 1253 and memory 1254 for storing instructions (e.g., modules), for example, executable by at least one of the one or more processors. As an example, a computer may include one or more network interfaces (e.g., wired or wireless), one $$(u_{dr})_{New} = \mathcal{M}_1 \left\{ \dfrac{\left(1 - \alpha_G \cdot \left[\dfrac{\mathcal{V}_1}{1+(\mathcal{V}_1-1)\left(\frac{\beta-\mathcal{V}_2}{1-\mathcal{V}_2}\right)^2}\right]\right)\left(\dfrac{\mathcal{V}_1}{1+(\mathcal{V}_1-1)\left(\frac{\beta-\mathcal{V}_2}{1-\mathcal{V}_2}\right)^2}\right)^{\mathcal{H}_{[@\alpha_G]^{u_{ch}}}}}{\alpha_G \cdot \left(\dfrac{\mathcal{V}_1}{1+(\mathcal{V}_1-1)\left(\frac{\beta-\mathcal{V}_2}{1-\mathcal{V}_2}\right)^2}\right)\sqrt{\dfrac{\rho_G}{\rho_L}} + 1 - \alpha_G \cdot \left(\dfrac{\mathcal{V}_1}{1+(\mathcal{V}_1-1)\left(\frac{\beta-\mathcal{V}_2}{1-\mathcal{V}_2}\right)^2}\right)} \right\} \sin(\theta) +$$

$$\mathcal{M}_2 \left(\left\{\sqrt{gD}\left[\left(\mathcal{H}_1 - \mathcal{H}_2\left[\dfrac{(N_\mu)^{\mathcal{H}_3}}{(N_{E\ddot{o}})^{\mathcal{H}_4}}\right]\right)\left(\alpha_G^{\mathcal{H}_5}[1-\alpha_G]^{\mathcal{H}_6}\right)\right]\right\}\right)\cos(\theta)$$

As an example, a formulation such as that of Eq. (21) or other formulation may be suitable for acting as a desired proxy model, or surrogate. As an example, given the example Eq. (21), if new data permits, one may substitute the different relationships with more refined and/or elaborate parameterization to take into consideration, say, viscosity and/or pipe diameter (e.g., and so on).

FIG. 11 shows an example plot 1110 and an example plot 1130. The plots 1110 and 1130 are cross plots of $\alpha_G$ obtained or more graphics cards, a display interface (e.g., wired or wireless), one or more displays (e.g., display units), etc. As an example, data may be provided in the storage device(s) 1255 where the computer(s) 1252 may access the data via the network(s) 1256 and process the data via the module(s) 1257, for example, as stored in the memory 1254 and executed by the processor(s) 1253.

As an example, one or more of the blocks 1213, 1215, 1217 and 1219 may be provided as one or more modules (see, e.g., the module(s) 1257) that are executable by a system such as the system 1250. As an example, the system 1250 can include one or more interfaces that receive information, one or more processors that execute instructions to determine optimal parameter values based at least in part on at least a portion of the received information, derive functions based at least in part on a portion of the optimal parameter values (e.g., functions for parameters of a multi-parameter proxy model) and determine, based at least in part on the functions, a value of a fluid production network variable. Such a system may include a graphics processor (e.g., a GPU) that renders information to a display, optionally during execution of instructions that determine, derive, etc. As an example, the system may render a graphical representation of a network (e.g., a fluid production network) to a display. As an example, such a representation may optionally be rendered with terrain, which may include GIS, satellite and/or other information. As an example, imagery may be rendered by a system to a display along with actual and/or "virtual" representations of at least a portion of a fluid production network. For example, consider the perspective view of a geologic environment 403 of FIG. 4, which shows conduits that correspond to portions of the network 410.

As an example, a system may render a graphical user interface (GUI) to a display (e.g., via execution of instructions stored in memory of the system) that may allow a user (e.g., via one or more input mechanisms) to adjust, alter, change, etc. one or more pieces of equipment and initiate execution of a method such as the method 1210. As an example, results of the method 1210 as performed by the system may be rendered to the display. As an example, such results may be rendered with respect to at least a portion of a network, for example, in a pane that may be selectable for display of results. For example, consider positioning a cursor (e.g., via a finger, a stylus, a mouse, etc.) of a display over a portion of the network 410 (e.g., optionally in a view such as the view 403) and selecting that portion (e.g., a location, a piece of equipment, etc.) via a hover, a tap, a click, voice, etc., and, in response to the selecting, rendering to the display information that corresponds to that portion (e.g., consider information such as phase information, flow regime information, property information, inclination information, diameter information, etc.). In such an example, a user may optionally adjust one or more inputs to a method and initiate execution of one or more instructions to, for example, update results based at least in part on the adjusted one or more inputs.

As an example, a fluid property may be utilized to fit one or more parameters. As an example, a fluid property may be viscosity. As an example, a fluid property may be density. As an example, a fluid property may be other than viscosity or density. As an example, a fluid property may be associated with a fluid phase. In such an example, the fluid phase may be of a single fluid or of multiple fluids. For example, consider a liquid phase that is an oil liquid phase or a water liquid phase; or, for example, a liquid phase that is a mixture of oil as a liquid and water as a liquid. As to a mixture, a fluid property may be a fluid property of the mixture where, for example, a value is determined based at least part on composition (e.g., fraction by mass, fraction by volume, etc.). As an example, a fluid property of a mixture may be defined as a difference between two (e.g., adjacent) phases. For example, a fluid property $\Delta\mu$ may be defined as a difference between viscosity of water and viscosity of oil. As an example, for three-phase flow, a method can include defining viscosity (e.g., or density, etc.) as a weighted fraction of the fluid phases (e.g., in a conduit, etc.).

As an example, a technique can implement a model where exponents and coefficients (e.g., constants) used to fit the model to data may, themselves, be made variable to one or more stated variables (e.g., inclination, diameter, viscosity, density, etc.). As an example, a model may include a vertical portion and a horizontal portion. In such an example, the number of "variable" parameters in the vertical portion and the number of "variable" parameters in the horizontal portion may be the same or may differ. As an example, depending on the forces, etc. involved in flow, a model may be include a portion or portions not characterized by direction. For example, a model may include a single portion without that single portion being characterized as "horizontal" or "vertical". For example, where a relevant portion of a network is horizontal (e.g., substantially flat ground), a model may be structured without resort to "horizontal" and "vertical". As another example, an analysis may account for orientation of conduits in a single portion of the model. As an example, a model can include with coefficients and exponents made variable to one or more parameters.

As an example, a production engineer may perform a workflow whereby a design scenario is proposed followed by a simulation to generate simulation results. As an example, such a simulation may optionally be performed using the PIPESIM® framework. As an example, based at least in part on simulation results, the production engineer may modify the design, for example, to achieve certain criteria such as, for example, delivery flow rates and pressure, avoidance of flow assurance issues (e.g., maximum erosional velocities, hydrate formation, wax deposition, etc.).

As an example, a system may include one or more modules that provide for development of at least a portion of a production network based at least in part on described goals and constraints. In such an example, the system may develop a design that optimizes one or more objectives (e.g., minimum costs, maximum value, minimum risk, etc.).

As an example, a workflow may include setting at least one goal, such as, for example: "connect wells to processing facility". Such a workflow may include setting at least one constraint, such as, for example: "avoid regions X, Y, Z; ensure flow; avoid wax and erosion". As an example, such a workflow may include setting at least one objective, such as, for example: "minimize costs".

As an example, a workflow may include setting one or more lifecycle factors. In such an example, the workflow may consider dynamics of a project that may occur over time. For example, a lifecycle may consider one or more fracturing processes that may act to increase production of a resource. In such an example, fracturing may be performed at one or more stages (e.g., multistage hydraulic fracturing). As an example, hydraulic fracturing may benefit from a reliable source of water for at least one stage of hydraulic fracturing. As an example, a network may be developed that allows for multidirectional flows. As an example, a network may be developed that allows for flow of a first resource over a period of time and flow of a different resource over a period of time. For example, a pipeline with appropriate equipment may provide for flow of water from a water source to a well site for fracturing for a first period of time and then at least a portion of that pipeline with appropriate equipment may provide for flow of a resource from the well site to a facility for a second subsequent period of time. In such an example, where fracturing is to be performed in stages with production between stages, the flows may be switched as part of a lifecycle plan.

As an example, a method can include receiving information that includes data that correspond to a range of a fluid production network variable; based at least in part on a portion of the data, determining optimal parameter values of a multi-parameter proxy model for at least a portion of the range of the fluid production network variable; based at least in part on a portion of the optimal parameter values, deriving functions for the parameters of the multi-parameter proxy model; and based at least in part on the functions, determining a value of the fluid production network variable for a fluid production network. In such an example, the fluid production network variable may be or include, for example, conduit inclination, a conduit cross-sectional flow dimension, a fluid property of at least one fluid or another variable. As an example, a fluid property of at least one fluid may be or include a fluid property associated with a mixture of fluids.

As an example, a method can include receiving information that includes data that correspond to individual ranges of a plurality of fluid production network variables. As an example, a method can include a multi-parameter proxy model, which may be or include, for example, a drift-flux model. As an example, a proxy model may include directional terms for fluid flow where, for example, the directions of the directional terms may be orthogonal. As an example, directional terms may include a vertical term and/or a horizontal term, which may be defined, for example, with respect to a direction of gravity.

As an example, a system can include a processor; memory accessible by the processor; and modules that include processor-executable instructions to instruct the system to: receive information that includes data that correspond to a range of a fluid production network variable, based at least in part on a portion of the data, determine optimal parameter values of a multi-parameter proxy model for at least a portion of the range of the fluid production network variable, and, based at least in part on a portion of the optimal parameter values, derive functions for the parameters of the multi-parameter proxy model. In such an example, the fluid production network variable may be or include, for example, conduit inclination, a conduit cross-sectional flow dimension, a fluid property of at least one fluid or other variable.

As an example, a system may receive information that includes data that correspond to individual ranges of a plurality of fluid production network variables. In such an example, the plurality of fluid production network variables may include at least one of conduit inclination, a conduit cross-sectional flow dimension and a fluid property of at least one fluid.

As an example, a system may include a multi-parameter proxy model that may be or include, for example, a drift-flux model. In such an example, the drift-flux model may be or include, for example, a drift velocity model.

As an example, a system can include a proxy model that may include directional terms for fluid flow where, for example, the directions of the directional terms are orthogonal, where the directional terms include a vertical term and a horizontal term defined with respect to a direction of gravity and where the parameters of the proxy model include parameters associated with the vertical term and parameters associated with the horizontal term.

As an example, one or more computer-readable storage media can include computer-executable instructions executable by a computer where, for example, the instructions including instructions to: receive information that includes data that correspond to a range of a fluid production network variable; based at least in part on a portion of the data, determine optimal parameter values of a multi-parameter proxy model for at least a portion of the range of the fluid production network variable; and, based at least in part on a portion of the optimal parameter values, derive functions for the parameters of the multi-parameter proxy model. In such an example, the fluid production network variable may be or include, for example, conduit inclination, a conduit cross-sectional flow dimension, a fluid property of at least one fluid, or another type of fluid production network variable.

As an example, instructions may instruct a system (e.g., a computer, etc.) to receive information that includes data that correspond to individual ranges of a plurality of fluid production network variables. In such an example, the plurality of fluid production network variables may be or include, for example, conduit inclination, a conduit cross-sectional flow dimension and a fluid property of at least one fluid.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

Figure 13:
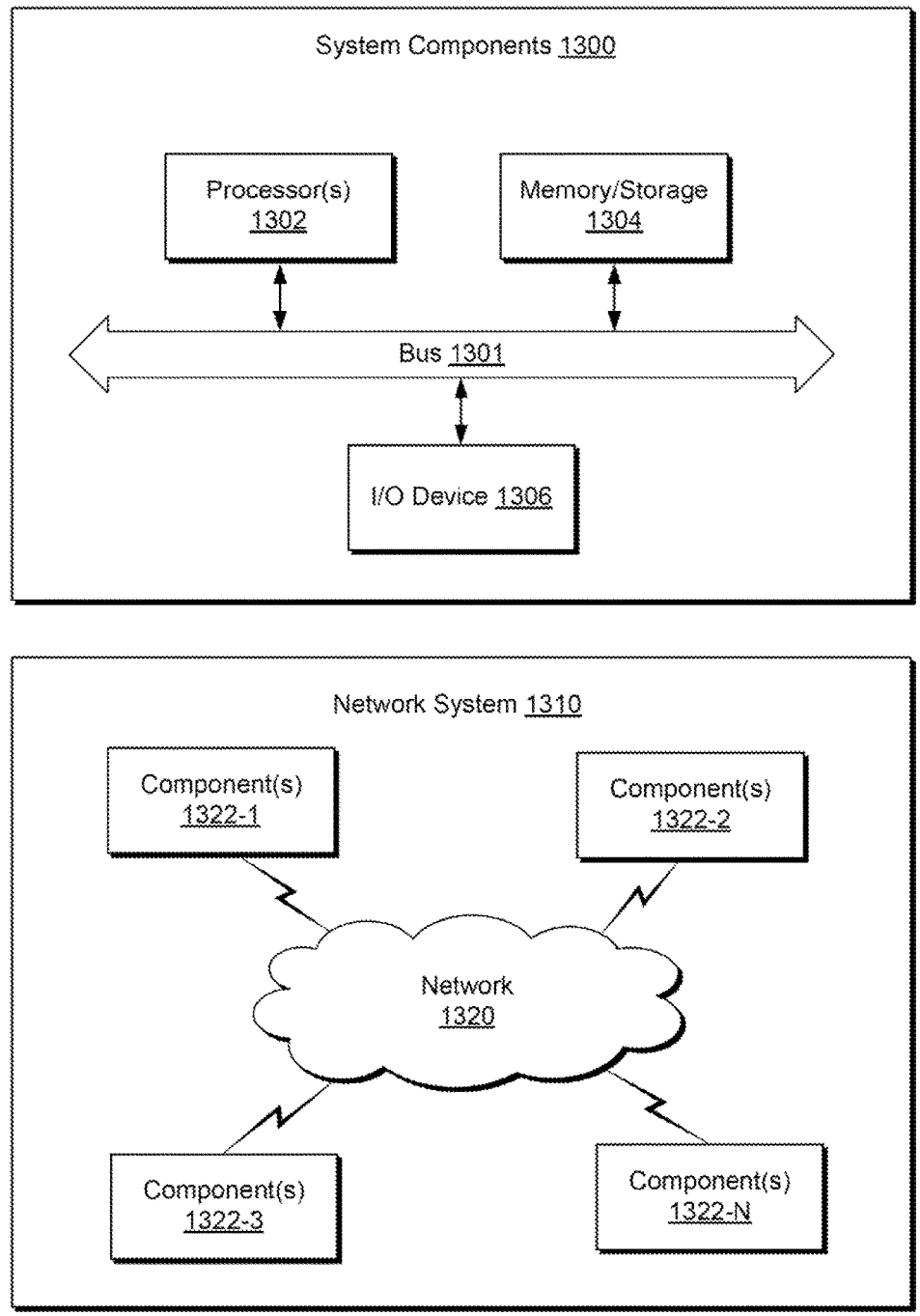
FIG. 13 illustrates example components of a system and a networked system.

FIG. 13 shows components of an example of a computing system 1300 and an example of a networked system 1310. The system 1300 includes one or more processors 1302, memory and/or storage components 1304, one or more input and/or output devices 1306 and a bus 1308. In an example embodiment, instructions may be stored in one or more computer-readable media (e.g., memory/storage components 1304). Such instructions may be read by one or more processors (e.g., the processor(s) 1302) via a communication bus (e.g., the bus 1308), which may be wired or wireless. The one or more processors may execute such instructions to implement (wholly or in part) one or more attributes (e.g., as part of a method). A user may view output from and interact with a process via an I/O device (e.g., the device 1306). In an example embodiment, a computer-readable medium may be a storage component such as a physical memory storage device, for example, a chip, a chip on a package, a memory card, etc. (e.g., a computer-readable storage medium).

In an example embodiment, components may be distributed, such as in the network system 1310. The network system 1310 includes components 1322-1, 1322-2, 1322-3, . . . 1322-N. For example, the components 1322-1 may include the processor(s) 1302 while the component(s) 1322-3 may include memory accessible by the processor(s) 1302. Further, the component(s) 1322 may include an I/O device for display and optionally interaction with a method. The network 1320 may be or include the Internet, an intranet, a cellular network, a satellite network, etc.

Although only a few example embodiments have been described in detail above, those skilled in the art will readily appreciate that many modifications are possible in the example embodiments. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words "means for" together with an associated function.

What is claimed is:

1. A method comprising:
    receiving information that comprises data that correspond to a range of a fluid production network variable;
    based at least in part on a portion of the data, determining optimal parameter values of a multi-parameter proxy model for at least a portion of the range of the fluid production network variable;
    based at least in part on a portion of the optimal parameter values, deriving different functions for corresponding different parameters of the multi-parameter proxy model wherein one or more of the different functions depend on at least one of inclination, a pipe characteristic and viscosity;
    based at least in part on the functions and the multi-parameter proxy model, determining a value of the fluid production network variable for a fluid production network; and
    based at least in part on the value, making a control decision to actuate a mechanism of the fluid production network.

2. The method of claim 1 wherein the fluid production network variable comprises conduit inclination.

3. The method of claim 1 wherein the fluid production network variable comprises a conduit cross-sectional flow dimension.

4. The method of claim 1 wherein the fluid production network variable comprises a fluid property of at least one fluid.

5. The method of claim 4 wherein the fluid property of at least one fluid comprises a fluid property associated with a mixture of fluids.

6. The method of claim 1 wherein the receiving information that comprises data comprises receiving information that comprises data that correspond to individual ranges of a plurality of fluid production network variables.

7. The method of claim 1 wherein the proxy model comprises a drift-flux model.

8. The method of claim 1 wherein the proxy model comprises directional terms for fluid flow wherein the directions of the directional terms are orthogonal.

9. The method of claim 8 wherein the directional terms comprise a vertical term and a horizontal term defined with respect to a direction of gravity.

10. A system comprising:
    a processor;
    memory accessible by the processor; and
    processor-executable instructions stored in the memory to instruct the system to:
        receive information that comprises data that correspond to a range of a fluid production network variable,
        based at least in part on a portion of the data, determine optimal parameter values of a multi-parameter proxy model for at least a portion of the range of the fluid production network variable,
        based at least in part on a portion of the optimal parameter values, derive different functions for corresponding different parameters of the multi-parameter proxy model wherein one or more of the different functions depend on at least one of inclination, a pipe characteristic and viscosity,
        based at least in part on the functions and the multi-parameter proxy model, determine a value of the fluid production network variable for a fluid production network; and
        based at least in part on the value, make a control decision to actuate a mechanism of the fluid production network.

11. The system of claim 10 wherein the fluid production network variable comprises conduit inclination, a conduit cross-sectional flow dimension or a fluid property of at least one fluid.

12. The system of claim 10 wherein to receive information that comprises data receives information that comprises data that correspond to individual ranges of a plurality of fluid production network variables.

13. The system of claim 12 wherein the plurality of fluid production network variables comprise at least one member selected from a group consisting of conduit inclination, a conduit cross-sectional flow dimension and a fluid property of at least one fluid.

14. The system of claim 10 wherein the proxy model comprises a drift-flux model.

15. The system of claim 14 wherein the drift-flux model comprises a drift velocity model.

16. The system of claim 10 wherein the proxy model comprises directional terms for fluid flow wherein the directions of the directional terms are orthogonal, wherein the directional terms comprise a vertical term and a horizontal term defined with respect to a direction of gravity and wherein the parameters of the multi-parameter proxy model comprise parameters associated with the vertical term and parameters associated with the horizontal term.

17. One or more non-transitory computer-readable storage media comprising computer-executable instructions executable by a computer, the instructions comprising instructions to:
    receive information that comprises data that correspond to a range of a fluid production network variable;
    based at least in part on a portion of the data, determine optimal parameter values of a multi-parameter proxy model for at least a portion of the range of the fluid production network variable;
    based at least in part on a portion of the optimal parameter values, derive different functions for corresponding different parameters of the multi-parameter proxy model wherein one or more of the different functions depend on at least one of inclination, a pipe characteristic and viscosity;
    based at least in part on the functions and the multi-parameter proxy model, determine a value of the fluid production network variable for a fluid production network; and
    based at least in part on the value, make a control decision to actuate a mechanism of the fluid production network.

18. The one or more non-transitory computer-readable storage media of claim 17 wherein the fluid production network variable comprises conduit inclination, a conduit cross-sectional flow dimension or a fluid property of at least one fluid.

19. The one or more non-transitory computer-readable storage media of claim 17 wherein to receive information that comprises data receives information that comprises data that correspond to individual ranges of a plurality of fluid production network variables.

20. The one or more non-transitory computer-readable storage media of claim 19 wherein the plurality of fluid production network variables comprise at least one member selected from a group consisting of conduit inclination, a conduit cross-sectional flow dimension and a fluid property of at least one fluid.

\* \* \* \* \*